(12) United States Patent
Khan

(10) Patent No.: US 11,437,537 B2
(45) Date of Patent: Sep. 6, 2022

(54) PEROVSKITE-SILICON TANDEM SOLAR CELL

(71) Applicant: KING FAHD UNIVERSITY OF PETROLEUM AND MINERALS, Dhahran (SA)

(72) Inventor: Firoz Khan, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 264 days.

(21) Appl. No.: 16/806,406

(22) Filed: Mar. 2, 2020

(65) Prior Publication Data
US 2021/0273127 A1 Sep. 2, 2021

(51) Int. Cl.
*H01L 31/0725* (2012.01)
*H01L 31/028* (2006.01)
*H01L 31/074* (2012.01)

(52) U.S. Cl.
CPC ...... *H01L 31/0725* (2013.01); *H01L 31/0284* (2013.01); *H01L 31/074* (2013.01)

(58) Field of Classification Search
CPC ............ H01L 31/0725; H01L 31/0284; H01L 31/074
See application file for complete search history.

(56) References Cited

U.S. PATENT DOCUMENTS

| | | | |
|---|---|---|---|
| 2016/0190377 A1* | 6/2016 | Green | H01L 51/4213 438/74 |
| 2018/0175112 A1 | 6/2018 | Robinson et al. | |
| 2018/0226529 A1* | 8/2018 | Uzu | H01L 27/302 |
| 2018/0374976 A1* | 12/2018 | Peibst | H01G 9/20 |
| 2019/0081189 A1 | 3/2019 | Mishima et al. | |

FOREIGN PATENT DOCUMENTS

WO   WO 2019/116031 A1   6/2019

* cited by examiner

*Primary Examiner* — Tae-Sik Kang
(74) *Attorney, Agent, or Firm* — Oblon, McClelland, Maier & Neustadt, L.L.P.

(57) ABSTRACT

Perovskite/silicon tandem solar cells have the potential to achieve high efficiencies through improvements to the optical and electrical parameters of perovskite/silicon tandem devices, via photon management, particularly using the optical band-edge shifting properties of silicon via surface modification of silicon. Silicon can directly extract the light generated charge carriers, which can achieve an efficiency of over 28%.

18 Claims, 31 Drawing Sheets

PEROVSKITE-SILICON TANDEM SOLAR CELL

BACKGROUND OF THE INVENTION

Field of the Invention

The present disclosure relates to solar conversion devices, systems and methods which may offer improved conversion efficiency relative to conventional photovoltaic units, particularly perovskite-silicon tandem devices including a porous silicon layer, which may be functional and have a modified porosity, and which may be n-doped or p-doped, and methods of making and using such devices.

Description of the Related Art

Modern civilization depends greatly on fossil fuels, including petroleum oil, coal, natural gas, etc., and nuclear energy for meeting various energy needs. Energy demand is increasing rapidly because of the rapid growth in the human population and a rising living standard. Finite fossil fuel resources and an increasing atmospheric concentration of greenhouse gases, which may be linked to global warming, air pollution, and health problems, are critical global challenges. Problems associated with nuclear energy include security as well as disposal of radioactive fission by-products.

In recent years, the use of renewable energy resources such as solar, hydropower, wind, and biomass has progressed, owing to several advantages over fossil fuels and nuclear energy. Amongst the so-called renewables, solar energy offers clean and abundant energy resources to human beings, which are being constantly replenished on a geological time horizon. Every minute, the sun irradiates the earth with enough energy to supply sufficient power for human needs for a year.

Solar photovoltaic (SPV) power research is proceeding on two fronts: making cheaper solar photovoltaic (SPV) devices; and enhancing efficiency. Solar photovoltaic (SPV) cells for terrestrial applications are typically made from inorganic semiconductor materials, e.g. Si, GaAs, CIGS (CuInGaSe), etc., which absorb a large percentage of solar radiation and convert it to electricity with conversion efficiencies over 20%. The cost of solar photovoltaic (SPV) energy is higher than the grid supply due to the costs of materials and processing.

Since the development of organic semiconductors, research and development (R&D) efforts have been made into the development of low-cost solar cells using organic materials or combinations of organic and inorganic materials. Recently, organic-inorganic perovskite (PVT) materials have attracted more attention for their use as solar radiation absorbers. The efficiency of perovskite (PVT) solar cells (PSCs) has risen steeply, from 3.8% to more than 25.2%, in just a few years. The perovskite (PVT) active layer combines the promise of solution processing with the ability to tailor the band-gap through ion substitution. Associated with their photovoltaic performance, perovskite (PVT) also exhibits high fractions of radiative recombination, with apparent carrier lifetimes of 250 ns or longer. Although perovskite (PVT) provides a unique combination of properties such as strong optical absorption, long diffusion length, and solution processability enabled by the relatively benign nature of intrinsic defects, perovskite (PVT) absorbs the solar spectrum only up to about 800 nm. Moreover, perovskite (PVT) has stability issues against UV radiation and moisture. To utilize a wide solar spectrum, a multi-junction/tandem structure is needed. The perovskite (PVT) element is typically used as the top cell in combination with the bottom cell of Si or CIGS (CuInGaSe) to make the tandem solar cell.

Multi-junction solar cells contain two or more single-junction solar cells in tandem based on different semiconductors. This arrangement can increase the incident photon-to-electricity conversion efficiency by separating the absorption of the polychromatic solar spectrum into different band-gaps. The largest band-gap solar cell is at the top and the band-gap decreases from top to bottom. In such a structure, the higher energy (shorter wavelength) photons are absorbed in the top (and lower) energies by the bottom cell. In this way, a wide range of solar radiation wavelengths can be absorbed and thereby provide increased output.

Multi-junction solar cells typically come in two varieties. A first variety is the monolithic multi-junction solar cell in which two or more single-junction solar cells are electrically series-connected via tunnel junction or through a recombination layer as shown in FIG. 1A. Multi-junction solar cells typically have only two terminals. A second variety is the mechanically stacked multi-junction solar cell, in which two or more single-junction solar cells are mechanically stacked, not internally connected via a tunnel junction, as shown in FIG. 1B. These types of solar cells have multi-terminals, i.e., 2-fold the number of single-junction solar cells.

Several limitations have been encountered in current research on perovskite (PVT)-silicon tandem solar cells. To enhance the absorption of perovskite (PVT)-based solar cells, tandem-type structures have been proposed. In the perovskite (PVT)-based tandem solar cells, two sub-cells are generally used, with the perovskite (PVT) being the top cell along and silicon or CIGS (CuInGaSe) as the bottom cell. The top cell can absorb solar radiation up to 800 nm, while the bottom cell can absorb the remaining part up to a cut-off wavelength, e.g., $\lambda_g \approx 1240/E_g$ in nm, of the bottom cell material, which is shown in FIG. 2. Monolithic cells have two terminals, whereas, mechanically stacked or split cells have four terminals, as shown in FIG. 3.

As single-junction photovoltaic (PV) technologies, both Si heterojunction (SJH)/Si heterojunction with an intrinsic thin layer (HIT) and perovskite (PVT)-based solar cells offer hope of high efficiencies. A traditional tandem cell design with these cells connected in series may improve the efficiency further. In *Appl. Phys. Lett.* 2015, 106, 013506 (Uzu) an external optical splitting system was positioned at 45° to split the solar spectrum at cut-off wavelengths of 550 nm, 600 nm, and 640 nm to enhance the resultant efficiency ($\eta$) of the combined cell. Short wavelength solar radiation was reflected to top cell, whereas, long wavelength radiation was transmitted to the bottom cell as shown in FIG. 3. Uzu used a $CH_3NH_3PbI_3$-based PSC (individual $\eta=15.3\%$ without filter) as top cell and a-Si(p)/a-Si(i)/Si(n)/a-Si(i)/a-Si(n) structure as bottom cell (individual $\eta=25.2\%$ without filter—where "a-Si" is amorphous silicon). The combined efficiency obtained was 28.0% at a cut-off wavelength of 550 nm. In this case, less than 3% $\eta$ improvement was obtained.

*Phys. Chem. Chem. Phys.* 2015, 77, 1619-1629 (Loper) describes mechanically stacked four-terminal systems using $CH_3NH_3PbI_3$-based PSC with fluorine-doped tin oxide (FTO) as a front contact and $MoO_x$ as a transparent back contact ($\eta=11.6\%$) and SJH as the bottom cell as shown in FIG. 4. In this case, the combined $\eta$ was enhanced to 13.4%.

*Ener. Env. Sci.* 2015, 5, 956-963 (Bailie) discloses a transparent solar module of $CH_3NH_3PbI_3$-based PSC (FTO on front contact and silver nanowire back contact) as a top solar module with total current (current density, $J_{sc}$=20 mA/cm$^2$ and total area=75 cm$^2$) and a Si solar module on bottom ($J_{sc}$=10 mA/cm$^2$ and total area=150 cm$^2$) as shown in FIG. 5. In this type of structure, both solar modules produced an equal current of 1.5 A.

*Opt. Exp.* 2015, 23, A263-A278 (Filipic) attempted to simulate a CH$_3$NH$_3$PbI$_3$ perovskite solar layer on top of a planar and textured silicon heterojunction (SHJ) using 2- and 4-terminals as shown in FIG. 6. The simulated η of two terminal and four terminal structures for flat and textured Si surfaces using a single-diode model are listed in Table 1. Filipic estimated the tandem cell η based on 4-terminals for a flat surface as 29.1% and for a textured surface as 30.1%. For 2-terminals, the maximum η was obtained for a flat surface of 30.2% and for a textured surface of 30.3%. Filipic indicates that ~1.1% η is enhanced after converting 4-terminal structure to 2-terminal structure for flat surface, while η is nearly the same for texture surface (Δη≈0.2%).

*Appl. Phys. Lett.* 2015, 106, 121105 (Mailoa) fabricated a 2-terminal CH$_3$NH$_3$PbI$_3$ perovskite solar on top with p-n junction Si crystalline solar cell (p$^{++}$-Si/n-Si) along with n$^{++}$-Si tunnel (T) junction. The structure of this type of 2-terminal tandem cell is shown in FIG. 7. The experimentally measured value of η was 13.7%.

A traditional tandem solar cell with a state-of-art perovskite (PVT) solar cells (PSCs) top sub-cell (η≈20%) and a heterojunction with an intrinsic thin layer (HIT) bottom (η≈24%) sub-cell produced only a modest tandem η of 25%. Traditional series-connected tandem designs suffer from low short circuit current density ($J_{sc}$) values due to band-gap mismatch and current matching constraints. *Appl. Phys. Lett.* 2015, 106, 243902 (Asadpour) proposed a bifacial Si heterojunction (SJH)-perovskite tandem design that decouples the optoelectronic constraints and provides an innovative path for improved η via scattered light from the ground as shown in FIG. 8A. In the bifacial configuration, the same state-of-the-art sub-cells achieve a normalized output η of 33%, exceeding the performance of a bifacial heterojunction with an intrinsic thin layer (HIT) structure at practical albedo reflections. The traditional tandem cell contained the higher band-gap perovskite ($E_g$≈1:55 eV) sub-structure stacked on top of the lower bandgap ($E_g$≈1:12 eV) c-Si heterojunction with an intrinsic thin layer (HIT)-sub-cell as seen in FIG. 8B. The bifacial tandem cell has a similar design except for the absence of an Al back contact. This allows the absorption of light reflected from the ground, as shown in FIG. 8C. In the case of the perovskite/heterojunction with an intrinsic thin layer (HIT) series tandem cell in FIG. 8B, the perovskite bandgap ($E_g$≈1.55 eV) is considerably smaller than the optimum bandgap of the top-cell ($E_g$≈1.75 eV). This makes the traditional tandem design sub-optimal because a 300 to 400 nm thick typical perovskite top-cell would absorb so many photons that the bottom heterojunction with an intrinsic thin layer (HIT) cell (c-Si absorber) would not be able to produce sufficient short circuit current density ($J_{sc}$). This mismatch in short circuit current density ($J_{sc}$) dramatically suppresses the power output from the tandem cell. Even for a relatively thin top-cell, the currents are mismatched by 4 mA/cm$^2$. Therefore, mild thickness control is essential in designing the traditional tandem cell with these mismatched sub-cells.

Once the cell thicknesses are determined from optical simulation, the analysis of carrier transport produces the full J-V characteristics. The individual J-V characteristics of perovskite (PVT) and heterojunction with an intrinsic thin layer (HIT) cells, as shown in FIG. 9A. The heterojunction with an intrinsic thin layer (HIT) solar cell has a higher short circuit current density ($J_{sc}$) but lower open-circuit voltage ($V_{oc}$) compared to the PSC (as $E_{g,Si}$<$E_{g,PVT}$). In a tandem structure, the sub-cell currents must be matched, as shown in FIG. 9B. The short circuit current density ($J_{sc}$) in the tandem cell (≈18 mA/cm$^2$) after current matching is lower than both the perovskite (PVT), approx. 24:5 mA/cm$^2$, and the heterojunction with an intrinsic thin layer (HIT), approx. 40:5 mA/cm$^2$, cells. The open circuit voltage ($V_{oc}$) of the tandem cell adds up to ~1.65 V from the sub-cells. The total efficiency is η≈25%, which is only slightly higher than the individual cells, η of the heterojunction with an intrinsic thin layer (HIT) of approx. 24% and perovskite, i.e., η≈20%. Therefore, with careful layer optimization, it is possible to obtain modest efficiency gains through traditional tandem configurations. However, it may not be cost-effective. Recently, *Science* 2016, 351, 151-155 (McMeekin) tailored the band-gap and absorption coefficient of HC(NH$_2$)$_2$Pb(I$_{(1-x)}$Br$_x$)$_3$ [FAPb(I$_{(1-x)}$Br$_x$)$_3$] via Cs doping to form mixed-cation lead mixed-halide perovskite absorber. McMeekin's perovskite material was used in a 4-terminal tandem solar cells to achieve η≈25%.

Recently, *Ener. Env. Sci.* 2017, 10, 2472-2479 (Wu) demonstrated a new homo-junction c-Si cell architecture suitable for a perovskite (PVT)/c-Si tandem solar cell. This structure allows high temperature processed compact and mesoporous TiO$_x$ layers to be used for the perovskite cell while allowing passivation layers on both sides of the c-Si sub-cell, thus maintaining a high open circuit voltage ($V_{oc}$) for the c-Si sub-cell in FIG. 10. A texture structure was used on the top of the cell. These innovations realized a 22.5% efficient monolithic tandem device.

*Nat. Ener.* 2017, 2, 17009 (Bush) achieved an efficiency of 23.6% for monolithic PVT/Si by merging an infrared-tuned heterojunction with an intrinsic thin layer (HIT) bottom cell with the cesium formamidinium lead halide perovskite (PVT) as seen in FIG. 11. Bush used an LiF antireflection coating (ARC) on the top of the cell. Moreover, *Ener. Environ. Sci.* 2018, 77, 3511 (Jost) achieved 25.5% conversion efficiency monolithic perovskite (PVT)-Si by employing a textured light management foil on the front surface of the tandem cell as seen in FIG. 12.

*Adv. Energy Mater.* 2019, 9, 1803241 (Mazzarella) inserted 110 nm thick SiO$_x$ interlayers with a refractive index of 2.6 at 800 nm between two sub-cells which enhanced the short circuit current density ($J_{sc}$, 1.4 mA/cm$^2$) of the heterojunction with an intrinsic thin layer (HIT) bottom cell as seen in FIG. 13. Mazzarella achieved a short circuit current density ($J_{sc}$) total (sum of $J_{sc}$ of both the sun-cells) of 38.7 mA/cm$^2$ and η of 25.2%.

*Sustainable Energy Fuels* 2019, 3, 1995 (Kohnen) fabricated perovskite (PVT)-Si tandem cells with an efficiency of 26% by optimizing the current mismatch between perovskite (PVT) top and Si bottom cells. Kohnen combines rear junction Si heterojunction with an intrinsic thin layer (HIT) bottom cells with p-i-n perovskite (PVT) top cells for fabricating monolithic tandem structure as shown in FIG. 14. Kohnen optimized the top contact and perovskite (PVT) thickness which enhance the short circuit current density ($J_{sc}$) value above 19.5 mA/cm$^2$. Kohnen also studied the short circuit current density ($J_{sc}$) mismatch between sub-cells dependency on the fill factor (FF) of the tandem cell using various illumination levels, observing that the fill factor (FF) of the tandem cell was enhanced for unmatched short circuit current density ($J_{sc}$). The electrical simulations results showed that 31% of η can be achieved.

Optical simulation results, seen in FIG. 15, show that there are two major losses in short circuit current density ($J_{sc}$) of 3.30 mA/cm² due to parasitic absorption and 4.65 mA/cm² due to reflection losses.

However, to date, the efficiencies of perovskite (PVT)/Si tandem solar cells remain nearly the same as the best reported integrated back contact (IBC) Si mono junction solar cell (26.7%). None of these monolithic tandem devices yet exceeds the single-junction c-Si efficiency due to the current mismatch of absorber materials, and absorption parasitic losses. As a consequence, high-efficiency tandem solar cell fabrication at low cost has been elusive. Fully optimized, the ultimate device with matched current could yield efficiency up to 31.6%.

*IEEE J. Photovolt.* 2013, 3(3), 1125-1131 by Wilkins et al. (Wilkins) discloses multijunction solar cells on silicon substrates for 1-sun applications. Wilkins describes device simulation, including porous silicon layers. Wilkins forms a silicon bottom subcell by diffusion of dopants into a silicon wafer. The top of Wilkins's wafer is made porous to create a compliant layer, and a III-V buffer layer is then grown epitaxially, followed by middle and top subcells. Because of the resistivity of the porous material, these designs are best suited to high-efficiency 1-sun applications. Wilkins describes multijunction solar cell simulations incorporating a porous silicon-compliant membrane with an efficiency of 30.7% under AM1.5G, 1-sun for low-threading dislocation density, decreasing to 23.7% for a threading dislocation density (TDD) of $10^7/cm^2$. Wilkins's mesoporous Si, considered a flexible material, does not build up stress in the lattice-mismatched upper film (e.g., GaAs), but deforms the porous membrane to absorb a part of the misfit stress and allow the upper film to relax. Wilkins discloses a monolithic tandem cell, but the silicon sub-cell is not joined with a perovskite up-face layer. Wilkins does not mention up-conversion layers in a tandem context. Wilkins teaches away from the use of the porous silicon for reaching >30% efficiencies in realistic sun conditions.

The poster entitled "Mesoporous silicon filled with functionalized molecules as novel thermoelectric hybrids" (HL 45.26) from the Apr. 4, 2019, Regensburg conference of the Deutschen Physikalischen Gesellschaft e. V. in the semiconductor physics section by Gostkowska et al. (Gostkowska) discloses hybrid thermoelectric materials based on porous silicon, linking macroscopic transport phenomena to microscopic structure and elementary excitations. Gostkowska associates mesoporous semiconductors and functionalized molecules in thermoelectric materials. Gostkowska describes the synthesis of mesoporous silicon by electrochemical etching in an etching cell, and poly(3-hexylthiophene-2,5-diyl) (P3HT), poly(3,4-ethylenedioxythiophene) polystyrene sulfonate (PEDOT:PSS), polypyrrole, and other functionalized molecules as hybrid candidates. Gostkowska discloses re-using the thermal component in the overall cell sequence, but does not use porous silicon to modify photoelectric uptake.

US 2019/0081189 A1 by Mishima et al. (Mishima I) discloses a method for manufacturing a stacked photoelectric conversion device including forming an intermediate transparent conductive layer on a light-receiving surface of a crystalline silicon-based photoelectric conversion unit including a crystalline silicon substrate, and forming a thin-film photoelectric conversion unit on the intermediate transparent conductive layer. Mishima I's device includes a crystalline silicon-based photoelectric conversion unit, an intermediate transparent conductive layer, and a thin-film photoelectric conversion unit. The light-receiving surface of Mishima I's crystalline silicon-based photoelectric conversion unit has a textured surface including a plurality of projections and recesses. The textured surface has an average height of 0.5 pm or more. The intermediate transparent conductive layer fills the recesses of the textured surface and covers the tops of the projections of the textured surface. At least a part of Mishima I's thin-film photoelectric conversion unit is deposited by a wet method. Mishima I does not disclose using a porous silicon layer and requires a textured layer. Mishima I's cell relies on an extended absorption surface for passing light through its silicon layers. Mishima I's tandem structures are separated by a heterogeneous layer, such as a transparent oxide layer different from the first conductive layer, e.g., titanium oxide versus ITO, or include a layer formed by a method different from the method for the conductive oxide layer, which may serve to suppress volatilization of residual organic material.

US 2018/0175112 A1 by Robinson et al. (Robinson) discloses a multi-junction photovoltaic device comprising a first sub-cell disposed over a second sub-cell, the first sub-cell comprising a photoactive region comprising a layer of perovskite material and the second sub-cell comprising a silicon heterojunction (SHJ). Robinson's photoelectric units are separated by an intermediate region comprising one or more interconnect layers, e.g., recombination layer(s) and/or tunnel junction(s). Robinson includes an "intermediate region," comprising one or more interconnect layers, which may be recombination layer(s) and/or tunnel junction(s). Robinson's p-type region may comprise a charge transporting material that then fills the pores of porous region, or Robinson's perovskite material may form a capping layer of the perovskite material over the porous scaffold material. While Robinson discloses a perovskite or an HTM-free perovskite based sub-cell in which the perovskite forms a bulk heterojunction with a semiconducting or insulating porous scaffold material, Robinson does not disclose porous silicon or its role in increased light utilization. Robinson illustrates a $TiO_2$ layer separating the perovskite layer from its intermediate region and/or sub-cell, whereby its perovskite material may infiltrate the nanostructured n-type layer (e.g. $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO) and forms a planar heterojunction with the p-type semiconductors.

WO 2019/116031 A1 by Kirner et al. (Kirner) discloses a multi-junction photovoltaic device comprising a first sub-cell comprising a perovskite material layer stacked on, and in electrical contact with, a second sub-cell, front of the multijunction photovoltaic device adapted to be exposed to incident light in use. The second sub-cell comprises a rear emitter p-type silicon structure. A tunnel junction is provided between the first and second sub-cells. Kirner's silicon sub cell comprises a rear emitter p-type cell having a preferably reflective, opaque rear electrode, e.g., Al or Ag in a thickness of e.g. 0.1 to 20 μm, which may reflect at least 80 or 90% of the incoming light in the wavelength range of 300 to 1200 nm. Kirner describes a porous scaffold material disposed between an n-type and p-type layer and (macroscopic) holes filled with metal in a passivation layer, but does not disclose porous silicon layer nor up-conversion. Moreover, Kirner uses a textured layer between its passivation layer and reflecting layer (opaque rear electrode).

US 2018/0019358 A1 by Ahn (Ahn) discloses a tandem solar cell comprising a perovskite solar cell laminated on a front surface of a crystalline silicon solar cell, a module comprising the tandem solar cell, and a method for manufacturing the same. Ahn describes a nano-electrode structure patterned on a front surface of a front transparent electrode of a solar cell in which a crystalline silicon solar cell and a perovskite solar cell are bonded via a junction layer, such that the optical path of the sunlight incident on the solar cell through the nano-electrode structure can be increased to improve the utilization rate of the light. Ahn's perovskite absorption layer may be laminated on the front surface of the mesoporous layer, but Ahn's mesoporous layer is indicated to be formed of the same metal oxide as its electron transport layer, such as oxides of Ti, Zn, In, Sn, W, Nb, Mo, Mg, Zr, Sr, Yr, La, V, Al, Y, Sc, Sm, Ga, In, or SrTi, preferably ZnO, $TiO_2$, $SnO_2$, $WO_3$, or $TiSrO_3$. Ahn does not disclose a porous silicon layer. Ahn also requires a texture structure, including an i-type amorphous silicon layer and a conductive amorphous silicon layer, sequentially formed on the rear surface of its crystalline silicon substrate. Ahn's texture structure changes the path of the vertical incident light through the rear surface to create a light scattering effect and increase the path of incident light.

US 2018/0019360 A1 by Mishima et al. (Mishima II) discloses a tandem-type photoelectric conversion device including, from a light-incident side: a first photoelectric conversion unit; an anti-reflection layer; a transparent conductive layer; and a second photoelectric conversion unit. Mishima II's first photoelectric conversion unit includes a light absorbing layer including a photosensitive material of a perovskite-type crystal structure represented by general formula $R^1NH_3M^1X_3$ or $HC(NH_2)_2M^1X_3$, wherein $R^1$ is an alkyl group, $M_1$ is a divalent metal ion, and X is a halogen. Mishima II's second photoelectric conversion unit includes a light absorbing layer having a bandgap narrower than a bandgap of the light absorbing layer in the first photoelectric conversion unit. Mishima II's anti-reflection layer and transparent conductive layer are in contact with each other, and a refractive index of the anti-reflection layer is lower than a refractive index of the transparent conductive layer. Mishima II has a top transparent conducting layer without an anti-reflective layer outwardly upon it, but has an intervening anti-reflective layer between its charge transporting layer and second transparent conducting layer, i.e., between the first and second photoelectric conversion units. Mishima II aims to reduce the reflection of light to the perovskite-type photoelectric conversion unit to increase the amount of light captured in the rear photoelectric conversion unit, by providing the anti-reflection layer and transparent conductive layer between these units.

US 2019/0227233 A1 by Clark et al. (Clark) discloses systems and methods growing rare earth (RE)-based integrated photonic and electronic layered structures on a single substrate. Clark's layered structure comprises a substrate, an epi-twist rare earth oxide layer over a first region of the substrate, and a rare earth pnictide layer over a second region of the substrate, wherein the first region and the second region are non-overlapping. Clark's substrate and/or silicon layer may include a porous silicon portion, optionally with two opposite electrical doping types, optionally generated by adding an additional silicon epitaxial layer to the substrate or the silicon layer. Clark describes optional arrangements in which rare earth oxides contact optionally porous silicon layers, and porous-Si-to-porous-Si layers may be formed. Clark describes that to provide a stable and lattice-matched buffer for perovskite growth on a silicon substrate, epitwist technology can be used for a crystalline rare earth oxide (cREO) layer on a <100> Si substrate, then a <110> cREO layer to reduce mismatch for perovskite growth. Thus, although Clark may disclose porous silicon, but the optional perovskite in Clark is grown upon an epi-twist rare earth oxide layer.

Phys. Stat. Solid. A 2017, 277(10), 1700179 by Boccard et al. (Boccard) disclose that metal reflectors or electrodes in contact with optoelectronic devices can induce parasitic light absorption, while a low $n_D$ layer inserted between the metal reflector and the optically active layer(s) reduces this absorption. Boccard investigates porous, nanoparticulate films as low $n_D$ layers, fabricating Si solar cells with nanoparticle/Ag rear reflectors, varying the porosity, and thus $n_D$ between 1.1 and 1.5, of the nanoparticle films, and the porous film effectiveness in reducing infrared parasitic absorption in the solar cells. Boccard does not require a porous silicon layer, nor indicate that the porous layer effectively solves its absorption problem.

The doctoral thesis entitled "Enhancing efficiency of TCO-less tandem dye sensitized solar cells by architecture optimization" submitted January 2016 at the Division of Green Electronics, Graduate School of Life Science and Systems Engineering, of the Kyushu Institute of Technology by Baranwal (Baranwal) discloses tandem dye sensitized solar cells (DSSCs) achieving comparable photoconversion efficiency to amorphous Si solar cells. Baranwal describes avoiding or altering the transparent conductive oxide (TCO) glass commonly used in the conventional tandem devices for flux efficient tandem DSSCs in combination with near infra-red (NIR) photon harvesting novel sensitizers. Baranwal describes stacking multiple DSSCs with the complementary light absorption and photon harvesting, without as many series TCO plates using a top cell TCO-DSSC and TCO-less back contact bottom cell and a dye adsorbed nanoporous $TiO_2$ layer as a photoanode. Baranwal describes porous Si, NiO, polytetrafluoroethylene (PTFE), and $TiO_2$ as a component of solar cells, some even as tandem structure, but only describes porous Si as a substrate. Baranwal describes perovskite solar cell and layers, but does not propose any particular structure using perovskite layers, nor any structure particularly having a perovskite layer contacting a porous silicon layer.

In light of the above, a need remains for modified and/or improved layered structures, including solar cell systems, particularly for tandem cells, such as perovskite tandem solar cells and/or tandem solar cells containing porous silicon layers optionally p-doped or n-doped, and methods of making and using such structures, including solar cells.

SUMMARY OF THE INVENTION

Aspects of the invention provide tandem photovoltaic cells comprising, in order relative to incident light: an anti-reflection outer layer; a transparent conductive oxide layer; a hole transport layer; a perovskite layer; an electron transport layer comprising $p^+$-porous silicon; and a back contact. Such cells may be modified by any permutation of the features described herein, particularly the following.

Inventive cells may further comprise an n-type silicon layer or a p-type silicon layer between the electron transport layer and the back contact. Inventive cells may further comprise: an n-type silicon layer between the electron transport layer and the back contact; and an $n^+$-doped n-type silicon layer as a homojunction with the n-type silicon layer, between the n-type silicon layer and the back contact. Inventive cells may further comprise: a p-type silicon layer, between the electron transport layer and the back contact; and an $n^+$-doped n-type silicon layer as a heterojunction with the p-type silicon layer, between the p-type silicon layer and the back contact.

The electron transport layer may comprises at least 90 wt. % $p^+$-porous silicon, relative to total electron transport layer weight. The electron transport layer comprises no filler. The electron transport layer may comprise no perovskite material beyond a depth of 10% of an electron transport layer thickness. The perovskite layer may directly contact the electron transport layer. The electron transport layer directly contacts the n-type silicon layer.

The anti-reflection outer layer may directly contact the transparent conductive oxide layer, the transparent conductive oxide layer may directly contact the hole transport layer, the hole transport layer may directly contact the perovskite layer, and/or the perovskite layer may directly contact the electron transport layer.

The perovskite layer may directly contact the electron transport layer, and/or the electron transport layer may directly contact the n-type or p-type silicon layer.

Inventive cells may comprise no antireflective layer between a charge transporting layer, light absorbing layers, and/or silicon layer. Inventive cells may comprise no reflective layer beneath the electron transport layer relative to the incident light.

The perovskite layer may comprise a compound of formula (I)

$$RNH_3PbX_3 \qquad (I),$$ 

wherein R is an alkyl group and X is a halide, e.g., wherein R is methyl or ethyl and X is Br or I.

Inventive cells may have a photon conversion efficiency of at least 20%.

Aspects of the invention provide methods of producing electricity comprising irradiating any permutation of the inventive cell described herein with sunlight.

Aspects of the invention provide methods of making any permutation of the inventive cell described herein, which methods may comprise: combining the perovskite layer with an upper surface of the electron transport layer, in a direction relative to the incident light.

Aspects of the invention provide methods of improving efficiency of a tandem perovskite solar cell, which methods may comprise: irradiating the incident light through the electron transport layer, comprising the porous silicon, of any permutation of the inventive cell described herein, wherein the photon conversion efficiency is improved relative to tandem perovskite solar cells lacking the porous silicon.

Aspects of the invention provide methods of improving the efficiency of a tandem solar cell, which methods may comprise: forming a perovskite layer on a electron transport layer comprising at least 90 wt. % $p^+$-porous silicon, relative to a total electron transport layer weight; and further processing to provide a tandem solar cell comprising, in order of incident light, an anti-reflection layer, a transparent conductive oxide layer, a hole transport layer, the perovskite layer, the electron transport layer, a p-type or n-type silicon layer, an $n^+$-doped silicon layer, and a back contact.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
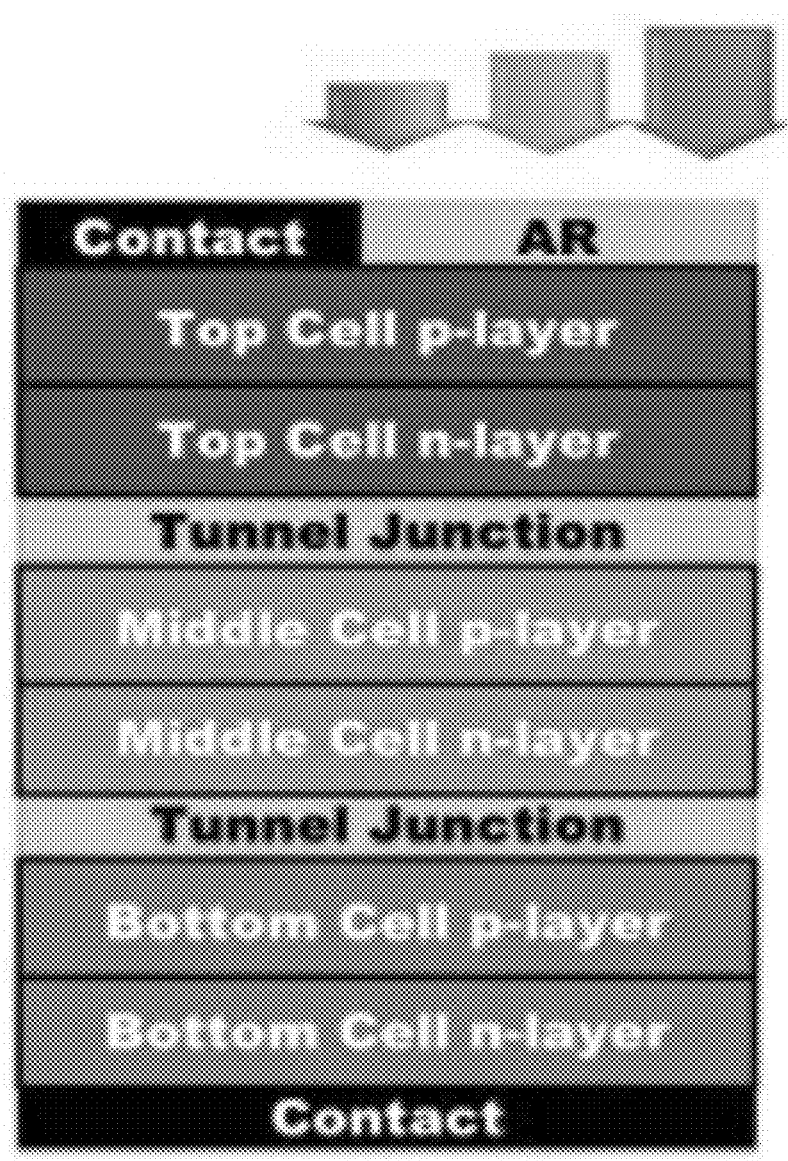
FIG. 1A shows a schematic of a mono-lithic (two terminal) three-junction solar cell as described in the Khan Ph.D. thesis, Jamia Millia Islamia, New Delhi, India (2012)

Aspects of the invention provide tandem photovoltaic cells comprising, in order relative to incident light: an anti-reflection layer (typically the outermost layer); a transparent conductive oxide layer; a hole transport layer; a perovskite layer; an electron transport layer comprising $p^+$-porous silicon; and a back contact. Inventive cells may further comprise an n-type silicon layer or a p-type silicon layer between the electron transport layer and the back contact. Inventive cells may further comprise: an n-type silicon layer between the electron transport layer and the back contact; and an $n^+$-doped n-type silicon layer as a homojunction with the n-type silicon layer, between the n-type silicon layer and the back contact. Inventive cells may further comprise: a p-type silicon layer, between the electron transport layer and the back contact; and an $n^+$-doped n-type silicon layer as a heterojunction with the p-type silicon layer, between the p-type silicon layer and the back contact.

The anti-reflection outer layer may directly contact the transparent conductive oxide layer. The transparent conductive oxide layer may directly contact the hole transport layer. The hole transport layer may directly contact the perovskite layer. The perovskite layer may directly contact the electron transport layer. The electron transport layer may directly contact an n-type silicon layer or a p-type silicon layer. The n-type silicon layer or a p-type silicon layer may directly contact an $n^+$-doped silicon layer. The $n^+$-doped silicon layer may directly contact the back contact. The back contact may make out the back of the device with respect to the direction of incident light. Inventive cells may comprise no antireflective layer between a charge transporting layer, light absorbing layers, and/or silicon layer. Inventive cells may comprise no reflective layer beneath the electron transport layer relative to the incident light.

Useful anti-reflection (or "anti-reflective") layers may include, for example, a material with an index of refraction (e.g., $n_D$~1.23±0.01, 0.02, 0.03, 0.04, 0.05, 0.06, 0.067, 0.07, 0.075, 0.08, 0.09, 0.1, 0.11, 0.125, 0.133, 0.14, or 0.15, or some range including any of these endpoints) different from the layer immediately beneath it, in an incident light direction, whereby the thickness of the anti-reflection layer(s) should be adjusted to cancel out wavelengths of incident light based on the differences in refractive indices and the thickness of the anti-reflection layer. The anti-reflection layer(s) may be a single layer coating or a multilayer coating (e.g., double-layer antireflective coating, multilayer gradient film, structured surface, etc.). For example, the anti-reflection layer(s) may include $MgF_2$, $SiN_x$, $SiO_2$, $TiZrO_2$, $ZnS$, $SiN$, $CeO_2$, $ITO$, $Si_3N_4$, $ZnO$, $TiO_2$, a fluoropolymer (PTFE, PVdF, PHFP, etc.), spirooxazine-doped polystyrene, vinyltrimethoxy silane films, $AlN_x$, PRODUCER® DARC® PECVD coating from Applied Materials, and/or any appropriate material described in *Appl. Surf. Sci.* 2019, 490, 278-282, "Multifunctional Optical Coatings and Light Management for Photovoltaics" in *Advanced Micro-and Nanomaterials for Photovoltaics*, S. L. Moffitt, et al., 2019, "Superhydrophobic Antireflective Polymer Coatings with Improved Solar Cell Efficiency" in *Super hydrophobic Polymer Coatings*, S. Sahoo, et al., 2019, "Multifunctional Optical Coatings and Light Management for Photovoltaics" in *Advanced Micro- and Nanomaterials for Photovoltaics* Ch. 7, S. L. Moffit, et al., 2019, pp. 153-173, *Mater. Sci. Appl.*, 2018, 9, 705-722, *Materials* 2016, 9(6), 497, each of which is incorporated by reference herein in its entirety.

Useful hole transport layers may include, for example, any material described in *Arab. J. Chem.* 2020, 73(1), 2526-2557, *J. Phys. Chem. C* 2018, 722(25), 14039-14063, *Adv. Mater. Interf.* 2018, 5(22), 1800882, *J. Mater. Sci.: Mater. Electron.* 2018, 29, 8847, *Chem. Rec.* 2017, 77(7), 681-699, or *Electron. Mater. Lett.* 2019, 75, 505, each of which is incorporated by reference herein in its entirety. Alternatively, or in addition to these, such materials may include NiO, NiO:Cu, $WO_3$, 1,3-bis(N-carbazolyl)benzene, 4,4'-bis(N-carbazolyl)-1,1'-biphenyl, 2,6-bis(9H-carbazol-9-yl)pyridine, 1,4-bis(diphenylamino)benzene, 4,4'-bis(3-ethyl-N-carbazolyl)-1,1'-biphenyl, N,N'-bis(3-methylphenyl)-N,N'-diphenylbenzidine, (E,E)-1,4-bis[2-[4-[N,N-bis(4-methoxyphenyl)amino]phenyl]vinyl]benzene (TOP-HTM-al), (E,E,E,E)-4,4',4'',4'''-[benzene-1,2,4,5-tetrayltetrakis(ethene-2,1-diyl)]tetrakis[N,N-bis(4-methoxyphenyl)aniline](TOP-HTM-α2), copper(II) phthalocyanine, cuprous thiocyanate, copper indium sulfide, cuprous iodide, 4,4'-cyclohexylidenebis[N,N-bis(4-methylphenyl)benzenamine], 4-(dibenzylamino)benzaldehyde-N,N-diphenylhydrazone, 9,9'-(2,2'-dimethyl[1,1'-biphenyl]-4,4'-diyl)bis-9H-carbazole, 2,2'-dimethyl-N,N'-di-[(1-naphthyl)-N,N'-diphenyl]-1,1'-biphenyl-4,4'-diamine, 9,9-dimethyl-N,N'-di(1-naphthyl)-N,N'-diphenyl-9H-fluorene-2,7-diamine, N,N'-di(1-naphthyl)-N,N'-diphenyl-(1,1'-biphenyl)-4,4'-diamine, N,N'-diphenyl-N,N'-bis-[4-(phenyl-m-tolylamino)phenyl]biphenyl-4,4'-diamine, N,N'-diphenyl-N,N'-di-p-tolylbenzene-1,4-diamine, dipyrazino[2,3-f:2',3'-h]quinoxaline-2,3,6,7,10,11-hexacarbonitrile, $N^4,N^{4'}$-bis[4-[bis(3-methylphenyl)amino]phenyl]-$N^4,N^{4'}$-diphenyl-[1,1'-biphenyl]-4,4'-diamine (DNTPD), 3-(4,6-diphenyl-1,3,5-triazin-2-yl)-9-phenyl-9H-carbazole (DPTPCz), 9-(2-ethylhexyl)-N,N,N,N-tetrakis((4-methoxyphenyl)-9H-carbazole-2,7-diamine) (EH44), indium(III) phthalocyanine chloride, lead phthalocyanine, poly(copper phthalocyanine), poly(N-ethyl-2-vinylcarbazole), poly-4-butyl-N,N-diphenylaniline (TPD), poly(9-vinylcarbazole), poly(1-vinylnaphthalene), 2,8-bis(diphenylphosphineoxide) dibenzofuran (PPF), poly[bis(4-phenyl)(2,4,6-trimethylphenyl)amine] (PTAA), $N_2,N_2,N_2',N_2',N_7,N_7,N_7',N_7'$-octakis(4-methoxyphenyl)-9,9'-spirobi[9H]-fluorene]-2,2',7,7'-tetramine (Spiro-MeOTAD, also sold as SHT-263 Solarpur® HTM), spiro[9H-fluorene-9,9'-[9H]xanthene]-2,7-diamine, spiro[9H-fluorene-9,9'-[9H]xanthene]-2,2',7,7'-tetramine, 2,4,6-tris(3-(carbazol-9-yl)phenyl)triazine (TCPZ), N,N,N',N'-tetrakis(4-methoxyphenyl)benzidine, N,N,N',N'-tetrakis(3-methylphenyl)-3,3'-dimethylbenzidine, N,N,N',N'-tetrakis(2-naphthyl)benzidine, tetra-N-phenylbenzidine, N,N,N',N'-tetraphenylnaphthalene-2,6-diamine, poly[(9,9-dioctylfluorenyl-2,7-diyl)-co-(4,4'-(N-(4-sec-butylphenyl)diphenylamine)] (TFB), tin(IV) 2,3-naphthalocyanine dichloride, titanyl phthalocyanine, titanium oxide phthalocyanine, tris(4-carbazoyl-9-ylphenyl) amine, tris[4-(diethylamino)phenyl]amine, 1,3,5-tris(diphenylamino)benzene, 1,3,5-tris(2-(9-ethylcabazyl-3)ethylene) benzene, 1,3,5-tris[(3-methylphenyl)phenylamino]benzene, 4,4',4''-Tris[2-naphthyl(phenyl)amino]triphenylamine, 4,4', 4''-tris[phenyl(m-tolyl)amino]-triphenylamine, vanadyl phthalocyanine, zinc phthalocyanine, or combinations of any of these. Some applications may call for pure, or at least 75, 80, 85, 90, 91, 92, 92.5, 93, 94, 95, 96, 97, 97.5, 98, 99, 99.1, 99.5, or 99.9 wt. % (relative to the total hole transporting layer weight) of inorganic or organic material, or of one, two, three, or four of the aforementioned compounds.

Useful $p^+$-doped porous silicon electron transport layers may include, for example, boron, aluminum, gallium, indium, and/or thallium, or may include purely, or at least 75, 80, 85, 90, 91, 92, 92.5, 93, 94, 95, 96, 97, 97.5, 98, 99, 99.1, 99.5, or 99.9 wt. % (relative to the total $p^+$-doped porous silicon electron transport layer weight), of one of these dopants. The porosity of the $p^+$-doped porous silicon electron transport layers may be, e.g., at least 15, 25, 33, 40, 45, 50, 55, 60, 67, or 75% and/or up to 99, 97.5, 95, 92.5, 90, 85, 80, 75, 70, 60, 50, or 40% porous, and/or may have a dielectric permittivity of, e.g., at least 1.5, 2, 2.5, 3, 3.5, 4, 4.5, or 5 and/or up to 12, 11, 10, 9, 8, 7.5, 7, 6.5, 6, 5.5, or 5.

Useful n-type silicon layers may include, for example, arsenic, phosphorus, antimony, bismuth, and/or lithium, for silicon wafers. For gallium arsenide base material, n-type doping may include tellurium, sulfur (substituting As), tin, silicon, and/or germanium (substituting Ga), and p-type doping may include beryllium, zinc, chromium (substituting Ga), silicon, and/or germanium (substituting As). For gallium phosphide base material, n-type doping may include tellurium, selenium, and/or sulfur (substituting phosphorus), and p-type doping may include zinc, magnesium (substituting Ga), and/or tin (substituting P). For gallium nitride, indium gallium nitride, or aluminium gallium nitride base material, n-type doping may include silicon (substituting Ga), germanium (substituting Ga), and/or carbon (substituting Ga), and p-type doping may include magnesium (substituting Ga). For cadmium telluride base material, n-type doping may include indium, aluminum (substituting Cd), and/or chlorine (substituting Te), and p-type doping may include phosphorus (substituting Te), lithium, and/or sodium (substituting Cd). For cadmium sulfide base material, n-type doping may include gallium (substituting Cd), iodine, and/or fluorine (substituting S), and p-type doping may include lithium and/or sodium (substituting Cd).

Useful $n^+$-doped silicon layers (homojunctions with the n-type silicon layers) may include, for example, phosphorus, arsenic, antimony, bismuth, and/or lithium. N-doped semiconductor layers may supplant silicon with the elements described above regarding p-doped base materials.

The electron transport layer may comprises at least 90, 91, 92, 92.5, 93, 94, 95, 96, 97, 97.5, 98, 99, 99.1, 99.5, or 99.9 wt. % $p^+$-porous silicon, relative to the total weight of the electron transport layer. The electron transport layer may be only $p^+$-porous silicon, having nothing more than the doping and inevitable impurities as its contents. The electron transport layer comprises no filler. The electron transport layer may comprise no perovskite material (measurable under standard analytical techniques) beyond a depth of 25, 20, 17.5, 15, 12.5, 10, 9, 8, 7.5, 7, 6, 5.5, 5, 4.5, 4, 3.5, 3, 2.5, 2, 1.5, 1, 0.75, 0.5, 0.1, or 0.01% of the thickness of the electron transport layer.

Inventive cells may have a photon conversion efficiency of at least 17.5, 18, 19, 20, 21, 22, 22.5, 23, 24, 25, 26, 27, 27.5, 28, 29, 30, 31, 32, 32.5% or more and/or up to 40, 39, 38, 37.5, 37, 36, or 35%.

Aspects of the invention provide methods of producing electricity comprising irradiating any permutation of the inventive cell described herein with sunlight, or some other form of light sufficient to induce a photoelectric excitation in the underlying solar cell. This could include something like AM1.5G, AM1.5D, and/or AM0. For example the light source may contain, as a percent of the irradiation spectrum, for example, no or at least 0.01, 0.1, 0.333, 0.5, 0.67, 0.75, 1, 1.125, 1.25, 1.375, 1.5, 1.625, 1.75, 1.875, or 2% and/or up to 5, 4.5, 4, 3.5, 3, 2.5, 2.25, 2, 1.75, 1.67, 1.5, 1.33, 1.25, 1.125, or 1% light at wavelengths 300 to 400 nm, at least 10, 11, 12, 12.5, 13, 14, 15, 16, 17, 17.5, 18, 19, or 20% and/or up to 25, 24, 23, 22.5, 22, 21, 20, 19.5, 19, 18.5, 18, or 17.5% light at wavelengths 400 to 500 nm, at least 12.5, 13, 14, 15, 16, 17, 17.5, 18, 19, or 20% and/or up to 27.5, 25, 24, 23, 22.5, 22, 21, 20, or 19.5% light at wavelengths 500 to 600 nm, at least 10, 11, 12, 12.5, 13, 14, 15, 16, 17, 17.5, 18, 19, or 20% and/or up to 25, 24, 23, 22.5, 22, 21, 20, 19.5, 19, 18.5, 18, or 17.5% light at wavelengths 600 to 700 nm, at least 10, 10.5, 11, 11.5, 12, 12.5, 13, 13.5, 13.75, 14, 14.25, 14.5, 15% and/or up to 20, 19.5, 19, 18.5, 18, 17.5, 17, 16.5, 16, 15.5, 15, 14.5, or 14% light at wavelengths 700 to 800 nm, at least 8, 8.5, 9, 9.5, 10, 10.5, 11, 11.5, 12, 12.5, or 13% and/or up to 17.5, 17, 16.5, 16, 15.5, 15, 14.5, 14, 13.5, 13, 12.5, or 12% light at wavelengths 800 to 900 nm, at least 10, 10.5, 11, 11.5, 12, 12.5, 13, 13.5, 14, 14.5, 15, 15.25, or 15.5% and/or up to 21, 20, 19.5, 19, 18.5, 18, 17.5, 17, 16.5, 16, 15.5, or 15% light at wavelengths 900 to 1100 nm, and no or at least 0.01, 0.1, 0.333, 0.5, 0.67, 0.75, 1, 1.125, 1.25, 1.375, 1.5, 1.625, 1.75, 1.875, or 2% and/or up to 5, 4.5, 4, 3.5, 3, 2.5, 2.25, 2, 1.75, 1.67, 1.5, 1.33, 1.25, 1.125, or 1% light at wavelengths 1100 to 1400 nm.

Aspects of the invention provide methods of making any permutation of the inventive cell described herein, which methods may comprise: combining the perovskite layer with an upper surface of the electron transport layer, in a direction relative to the incident light. The deposition may be carried out by spin coating, spray coating, blade-coating, active layer coating, ultrasonic spray coating, vibration-assisted sequential spray coating, airbrush spray-coating, vacuum-deposited spray-coating, slot-die coating, physical vapor deposition (PVD), sputter coating, chemical vapor deposition (CVD), atomic layer deposition (ALD), flash evaporation, close space sublimation (CSS), and/or vapor-assisted solution processing.

Aspects of the invention provide methods of improving efficiency of a tandem perovskite solar cell, which methods may comprise: irradiating the incident light through the electron transport layer, comprising the porous silicon, of any permutation of the inventive cell described herein, wherein the photon conversion efficiency is improved relative to tandem perovskite solar cells lacking the porous silicon.

Aspects of the invention provide methods of improving the efficiency of a tandem solar cell, which methods may comprise: forming a perovskite layer on a electron transport layer comprising at least 90, 91, 92, 92.5, 93, 94, 95, 96, 97, 97.5, 98, 99, 99.1, 99.5, or 99.9 wt. % $p^+$-porous silicon, relative to a total electron transport layer weight; and further processing, e.g., by further coating and/or doping techniques customary in the art, to provide a tandem solar cell comprising, in order of incident light, an anti-reflection layer, a transparent conductive oxide layer, a hole transport layer, the perovskite layer, the electron transport layer, a p-type or n-type silicon layer, an $n^+$-doped silicon layer, and a back contact. The initial electron transport layer may be prepared as described in the examples or as otherwise known in the art. Porosities of the porous silicon in the electron transport layer may include densities of, e.g., no more than of the 10, 15, 20, 25, 30, 35, 40, 45, 50, 55, 60, 65, 70, 72.5, 75, 77.5, 80, 82.5, 85, 87.5, 90, 91, 92, 92.5, 93, 94, 95, 96, 97, 97.5, 98, 99, 99.1, 99.5, or 99.9% accepted non-porous density of Si (2.33 g/cm$^3$). The porosities of the porous silicon in the electron transport layer may involve, e.g., at least 1, 2.5, 5, 7.5, 10, 12.5, 15, 17.5, 20, 22.5, 25, 27.5, 30, 35, 40, 45, or 50 vol. % (void) and/or up to 95, 90, 85, 80, 75, 70, 65, 60, 55, 50, 45, 40, 35, 30, or 25%. Preferably the porosity in the electron transport layer is from 20 to 40%, preferably 25-35% or about 30%.

The perovskite layer may, for example, comprise a compound of formula (I)

$$RNH_3PbX_3 \quad (I),$$

wherein R is an alkyl group and X is a halide, particularly wherein R is methyl or ethyl and X is Br or I. Further R groups may be propyl, isopropyl, cyclopropyl, allyl, or C3 alkyl groups generally, butyl, isobutyl, s-butyl, cyclobutyl, or C4 alkyl groups generally, pentyl, isopentyl, neopentyl, s-pentyl, cyclopentyl, or C5 alkyl groups generally, etc. The halide may be F, Cl, Br, and/or I, as well as non-integer mixtures of these. The perovskite material may include one or more compounds, e.g., of formula $RNH_3MX_3$ or $HCH(NH_2)_2MX_3$, wherein R may be an alkyl group, such as methyl, ethyl, C3 alkyl, C4 alkyl, C5 alkyl, C5 alkyl, or the like, M is a divalent metal ion, e.g., Pb and/or Sn, X is a halogen, e.g., F, Cl, Br, and/or I, whereby 2 or 3 of the X may be the same halogen, as desired. For example, the perovskite material may include $CH_3NH_3PbI_3$, $CH_3NH_3PbIxCl_{3-x}$, $CH_3NH_3PbI_xBr_{3-x}$, $CH_3NH_3PbCl_xBr_{3-x}$, $HC(NH_2)_2PbI_3$, $HC(NH_2)_2bI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$, wherein x or y may be, e.g., at least 0, 0.01, 0.05, 0.1, 0.15, 0.2, 0.25, 0.33, 0.4, 0.45, 0.5, 0.55, 0.6, 0.67, 0.75, 0.85, 0.9, 1, 1.1, 1.15, 1.2, 1.25, 1.33, 1.4, or 1.5 and/or up to 2.9, 2.8, 2.75, 2.67, 2.6, 2.5, 2.4, 2.33, 2.25, 2.2, 2.1, 2.05, 2, 1.95, 1.9, 1.85, 1.8, 1.75, 1.7, 1.67, 1.6, 1.55, 1.5, 1.4, or 1.33. Also, useful perovskite materials may include those in which A in $AMX_3$ is partially doped with Cs, Sr, Ba, and/or Rb. Useful perovskite materials may include, e.g., $CH_3NH_3PbI_3$, $CH_3NH_3PbBr_3$, $Cs_2SnI_6$, and/or any described in *J. Phys. Chem. C* 2020, 727(1), 1207-1213, *J. Phys. Chem. Lett.* 2020, 77(1), 333-339, *Chem. Mater.* 2019, 37(20), 8515-8522, *ACS Appl. Mater. & Interf.* 2019, 77(37), 34408-34415, *Chem. Mater.* 2019, 37(17), 6387-6411, *ACS Appl. Mater. & Interf.* 2019, 77(35), 32076-32083, *ACS Sust. Chem. & Eng.* 2019, 7(16), 14217-14224, *Chem. Mater.* 2019, 37(15), 5832-5844, *ACS Appl. Mater. & Interf.* 2019, 77(24), 21627-21633, *ACS Energy Letters* 2019, 7(6), 1370-1378, *J. Phys. Chem. Lett.* 2019, 70(11), 3019-3023, *J. Phys. Chem. C* 2019, 723(19), 12521-12526, *J. Phys. Chem. C* 2019, 723(14), 9629-9633, *ACS Appl. Energy Mater.* 2019, 2(3), 2178-2187, *J. Phys. Chem. Lett.* 2019, 70(6), 1217-1225, *Chem. Rev.* 2019, 779(5), 3418-3451, *J. Phys. Chem. Lett.* 2019, 70(4), 864-869, *J. Am. Chem. Soc.* 2019, 777(3), 1235-1241, *Chem. Mater.* 2018, 30(22), 8280-8290, *J. Phys. Chem. C* 2018, 722(44), 25260-25267, *Chem. Mater.* 2018, 30(19), 6668-6674, *ACS Appl. Mater. & Interf.* 2018, 70(36), 30367-30378, *ACS Appl. Energy Mater.* 2018, 7(8), 3565-3570, *Chem. Mater.* 2018, 30(15), 4959-4967, *Chem. Mater.* 2018, 30(14), 4847-4856, *J. Phys. Chem. C* 2018, 722(25), 13548-13557, *ACS Energy Letters* 2018, 3(6), 1247-1253, *ACS Omega* 2018, 3(3), 2706-2714, *ACS Appl. Energy Mater.* 2018, 7(2), 387-392, *Inorg. Chem.* 2017, 50(24), 14991-14998, *ACS Appl. Mater. & Interf.* 2017, 9(49), 42708-42716, *ACS Appl. Mater. & Interf.* 2017, 9(46), 41006-41013, *ACS Nano* 2017, 77(8), 8072-8083, *J. Phys. Chem. Lett.* 2017, 5(16), 3726-3733, *ACS Energy Letters* 2017, 2(7), 1621-1627, *Nano Lett.* 2017, 77(6), 3563-3569, *J. Phys. Chem. C* 2017, 727(22), 12110-12116, *Inorg. Chem.* 2017, 50(11), 6302-6309, *J. Phys. Chem. Lett.* 2017, 5(7), 1651-1656, *J. Phys. Chem. Lett.* 2017, 5(6), 1211-1218, *J. Phys. Chem. Lett.* 2017, 5(6), 1278-1282, *J. Phys. Chem. Lett.* 2017, 5(1), 67-72, *J. Phys. Chem. Lett.* 2016, 7(18), 3603-3608, *J. Am. Chem. Soc.* 2016, 138(21), 8603-8611, *Nano Lett.* 2016, 16(6), 3563-3570, *Acc. Chem. Res.* 2016, 49(2), 347-354, *Chem. Mater.* 2016, 25(1), 284-292, *Materials Science in Semiconductor Processing* 2020, 109, 104915, *Adv. Energy Mater.* 2020, 70(3), 1902708, *Nature Energy* 2020, 5(1), 35-49, *J. Phys. Chem. Lett.* 2015, 6(13), 2452-2456, *Adv. Funct. Mater.* 2019, 29(49), 1906686, *Nature Comm.* 2019, 70(1) 1088, *Sci. Rep.* 2019, 9(1), 13311, *Sci. Rep.* 2019, 9(1), 17964, *Nature Comm.* 2019, 70(1), 504, *Phys. Rev. Lett.* 2019, 723(15), 5901, *Nanomater.* 2019, 9(10), 1481, *Appl. Phy. A* 2019, 725(8), 575, *J. Mater. Chem. C* 2019, 7(30), 9326-9334, *Nanomater.* 2019, 9(8), 1120, *Org. Electr.* 2019, 69, 343-347, *J. Mater. Chem. C* 2019, 7(18), 5314-5323, *Appl. Phys. A* 2019, 725(4), 229, *Chem. Comm.* 2019, 55(22), 3251-3253, *Solar Energy Mater. Solar Cells* 2019, 797, 451-458, *Nanoscale* 2019, 77(8), 3733-3740, *Adv. Energy Mater.* 2019, 9(3), 1802671, *Adv. Funct. Mater.* 2018, 25(52), 1803753, *Adv. Mater.* 2018, 30(42), 1704587, *Chem. Eur. J.* 2018, 24(47), 12183-12205,

*Nat. Sci. Rev.* 2018, 5(4), 559-576, *J. Photochem. Photobiol. C; Photochem. Rev.* 2018, 35, 74-107, *Adv. Sci.* 2018, 5(5), 1700387, *ChemPlusChem* 2018, 53(4), 279-284, *J. Phys. D; Appl. Phys.* 2018, 57(9), 093001, *Renew. Sustain. Energy Rev.* 2018, 52, 2471-2489, *Org. Electr.* 2018, 53, 249-255, *Adv. Energy Mater.* 2018, 5(3), 1700677, *Chem. Comm.* 2018, 54(29), 3640-3643, *J. Mater. Chem. C* 2018, 0(11), 2635-2651, *RSC Adv.* 2018, 5(37), 20952-20967, *J. Mater. Chem. A* 2018, 0(37), 18067-18074, *Renew. Sustain. Energy Rev.* 2017, 77, 131-146, *Nature Energy* 2017, 2(9), 17135, *Solar RRL* 2017, 7(6), 1700038, "Perovskite Materials: Solar Cell and Optoelectronic Applications" in *Encyclopedia of Inorganic and Bioinorganic Chemistry* Yang, et al. Wiley 2017, pp. 1-14, *Adv. Energy Mater.* 2017, 7(6), 1601297, *J. Mater. Chem. A* 2017, 5(23), 11462-11482, *J. Semicond.* 2017, 35(1), 011003, *Nano Energy* 2016, 30, 570-579, *Adv. Electr. Mater.* 2016, 2(11), 1600329, *Energy Environ. Sci.* 2016, 9(2), 323-356, *Energy Environ. Sci.* 2016, 9(6), 1989-1997, *J. Mater. Chem. A* 2016, 7(47), 18378-18382, *Angew. Chem. Int. Ed* 2015, 57(46), 13806-13810, each of which is incorporated by reference herein in its entirety.

Aspects of the invention provide structures that can avoid expensive concentrators and/or interfacial layers. Inventive structures may include a porous silicon layer, which may be an electron transporting layer, directly in contact with a perovskite layer, p-type silicon layer, and/or n-type silicon layer, e.g., without any interlayers, interfacial layers, emitter layers, and/or passivation layers, for example of Ti oxide(s), Zn oxide(s), In oxide(s), Sn oxide(s), W oxide(s), Nb oxide(s), Mo oxide(s), Mg oxide(s), Zr oxide(s), Sr oxide(s), Yr oxide(s), La oxide(s), V oxide(s), Al oxide(s), Y oxide(s), Sc oxide(s), Sm oxide(s), Ga oxide(s), In oxide(s), and/or SrTi oxide(s), e.g., ZnO, $TiO_2$, $SnO_2$, $WO_3$, and/or $TiSrO_3$. Passivation layers of inventive structures may be non-contiguously arranged between point contacts. Inventive structures need not contain one or more anti-reflection layer and/or transparent conductive layers between the perovskite or first photoelectric conversion unit and the silicon or second photoelectric conversion unit.

Inventive structures need not comprise textured layers and/or surfaces, or each layer may have a surface roughness of less than 0.5, 0.45, 0.4, 0.35, 0.3, 0.25, 0.2, 0.15, 0.1, 0.05, or 0.01 μm average height variation from the deposition plane or morphology height (i.e., twice the arithmetic mean roughness Ra is calculated in accordance with JIS B0601 (2001)). Such maximum morphology height may be a maximum value of morphology heights in observation regions (total 5 $mm^2$) in observation of a region of 1 $mm^2$ square at each of total five positions: at the central part in the surface of the substrate and in the vicinity of the corners of the substrate. No surface of the layers within inventive structures needs to be textured or modified, e.g., by reactive ion etching (RIE) and/or other similar plasma treatment, and such texturing and/or treatments may be avoided on 1, 2, 3, 4, 5, 6, 7, 8, 9, 10, or all layers, such as a transparent conductive oxide layer, silicon-based semiconductor layer (including, e.g., amorphous silicon, microcrystalline silicon such as material including amorphous silicon and crystalline silicon, amorphous silicon alloy, and/or microcrystalline silicon alloy such as silicon oxide, silicon carbide, silicon nitride, and/or silicon germanium), i-type amorphous silicon layer, conductive amorphous silicon layer, and/or an intrinsic silicon-based thin-film layer.

As used in the claims, "porous," may mean that the modified material includes pores, for instance, volumes within the body of the material where there is no material. The average largest dimension of the pores may be, for example, at least 0.1, 0.25, 0.5, 0.75, 1, 2.5, 5, 7.5, 10, 15, 20, 25, 33, 50, 75, 100, 150, 250, 500, 750, 1000, 2500, 5000, or 10000 nm and/or up to 500, 3300, 2500, 1500, 1000, 750, 500, 250, 125, 100, 75, 66.7, 50, 33.3, 25, 20, 15, 10, 7.5, 5, 3.33, 2.5, 2, 1, 0.9, 0.8, 0.75, 0.67, 0.6, 0.5, 0.4, 0.33, 0.25, 0.1, 0.075, 0.05, 0.025, or 0.01 μm. Nanopores may be considered to have pore sizes of less than 1 nm. Micropores may be considered to have pore sizes smaller than 2 nm. Mesopores may be considered to have pore sizes of from 2 nm to 50 nm. Macropores may be considered to have pore sizes of greater than 50 nm. The porous silicon layer may comprise 1, 2, 3, or 4 of nanopores, micropores, mesopores, and/or macropores.

Useful porous silicon layers need not contain any perovskite material, or contain no more than 5, 4, 3, 2.5, 2, 1, 0.5, 0.1, 0.01, 0.001, 0.0001, or 0.00001 wt. %, relative to total porous silicon layer weight, of perovskite material(s), either individually or in combination. Useful porous silicon layers need not contain n-type material, e.g., an oxide, selenide, and/or sulfide of Ti, Sn, Zn, Nb, Ta, W, In, Ga, Nd, Pd, Cu, and/or Cd, such as $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, CdO, $FeS_2$, CdS, ZnS, SnS, BiS, SbS, and/or $Cu_2ZnSnS_4$, or contain no more than 5, 4, 3, 2.5, 2, 1, 0.5, 0.1, 0.01, 0.001, 0.0001, or 0.00001 wt. %, relative to total porous silicon layer weight, of such n-type material(s), either individually or in combination.

Useful arrangements need not use backside reflection, though this feature may be additionally implemented if desired. Useful arrangements need not include an epi-twist rare earth oxide layer over the substrate, and/or a rare earth pnictide layer over the substrate, and/or any epi-twist rare earth oxide layer(s) and rare earth pnictide layer(s) are overlapping. Generally, all functional layers of inventive structures may be overlapping. Inventive structures need not include a low refractive-index $(n_D)$ layer, relative to the metal reflector and/or optically active layer(s), inserted between the metal reflector and the optically active layer(s). No layer in inventive structure needs to comprise any or, e.g., no more than 5, 4, 3, 2.5, 2, 1, 0.5, 0.1, 0.01, 0.001, 0.0001, or 0.00001 wt. %, relative to total layer metals weight, of Ag and/or rare earth metals (such as Sm, Sc, Gd, and/or Er).

Advantages of the Two-Terminal Tandem Architecture Over a Four-Terminal Architecture In four-terminal tandem devices, the two sub-cells are fabricated independently, stacked on top of each other and contacted individually. This has the advantage of process simplicity. However, using four-terminals implies also doubling all the power electronics, i.e., inverters, which increases the cost of the PV system. In the two-terminal architecture, fewer deposition steps and only one transparent electrode is required which reduces the manufacturing cost. The reduced number of electrodes also leads to less parasitic absorption in the inactive layers, which is why two-terminal tandems have a high practical efficiency potential. It has an open circuit voltage $(V_{oc})$, i.e., sum of the $V_{oc}$ of the two sub-cells, which is beneficial as high voltages result in reduced resistive losses in photovoltaic (PV) systems. However, two-terminal tandem cells also have some constraints: the two sub-cells are preferably designed to generate similar photocurrent under operation, as the tandem current will be limited by the sub-cell with the lower current. This current matching requirement limits the ideal top cell bandgap to a narrow range of 1.7 to 1.8 eV and makes the system more sensitive to spectral variations, requiring optimal operation a specific design for a specific geographic location. Finally, as the top cell layers are deposited onto the bottom cell, the top cell processing has to be performed such that the bottom cell performance is not affected. The bottom cell acts as a suitable substrate, which is especially challenging for cells with textured surfaces, as is typically the case for crystalline silicon cells.

The theoretical achievable efficiency for single-junction based Si solar cell is 33%. However, this theoretical limit extends to 43% for PVT/Si tandem solar cells for both the two-terminal or four-terminal configurations shown in FIG. 16. Due to several losses, a wide gap between experimentally achieved and theoretical efficiency is observed.

In solar tandem solar cells having a perovskite (PVT)-Si heterojunction with an intrinsic thin layer (HIT), a lower η is obtained than single-junction c-Si, even including several additional processing steps, and the processing and materials costs are high. The fabrication of cells containing perovskite (PVT)-Si heterojunctions with an intrinsic thin layer (HIT) is not cost-effective even if higher efficiency could be obtained without tandem structure. Perovskite (PVT) solar cells use either the mesoscopic or the planar architecture. Regardless of the cell architecture, high-efficiency lead halide perovskite (PVT) solar cells exclusively use hole-blocking layers (HBLs)/electron-transporting layers (ETLs) and hole-transporting layers (HTLs)/electron-blocking layers (EBLs). These intrinsic interfacial layers are preferred for achieving high open-circuit voltages ($V_{OC}$s) and efficiencies because intrinsic interfacial layers promote effective carrier separations and charge recombination reduction at the front contacts. In inverted structures, efficient perovskite solar cells have been achieved using organic hole-blocking layers (HBLs) and electron-blocking layers (EBLs).

Figure 17:
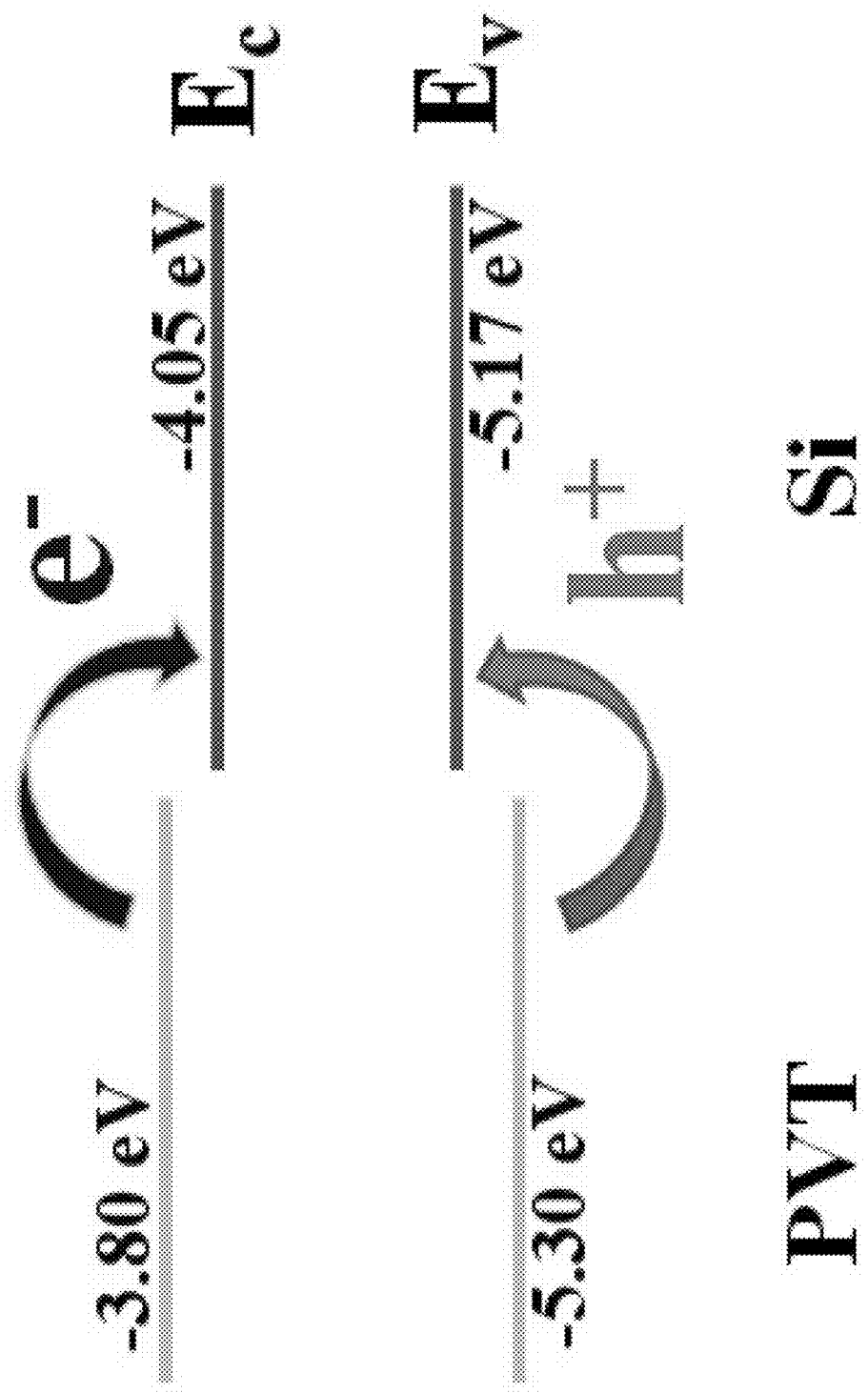
FIG. 17 shows the values of conduction band minimum (CBM) and valence band maximum (VBM) of perovskite (PVT) and crystalline silicon.

Both the conduction band minimum (CBM), $E_c$ (−4.05 eV) and valence band maximum (VBM), $E_v$ (−5.17 eV) of Si ($E_g \approx 1.12$ eV) lie between the lowest energy unoccupied molecular orbital and the highest energy occupied molecular orbital (HOMO) of the perovskite material, i.e., LUMO≈−3.80 eV, HOMO≈−5.30 eV, and $E_g \approx 1.50$ eV for methylammonium lead iodide as shown in FIG. 17. Thus, Si cannot be directly applied as the electron transporting material (ETM)/hole transporting material (HTM) and/or used to make a heterojunction with a perovskite (PVT) because both light-generated electrons and holes will move towards silicon. On the other hand, in a two-terminal perovskite (PVT)-Si-based tandem solar cell, the efficiency is low due to the current mismatch. Because the charge transporting layer, and tunnel junction between perovskite (PVT) and Si absorb light themselves.

The photons absorbed in the charge transporting layer and tunnel junction of perovskite (PVT)-Si tandem solar cell are not used for current generation, resulting in low current and hence low efficiency. The detailed absorption losses in various layers are known in the art. Therefore, the development a charge transporting layer which can to make the junction with perovskite (PVT) and photons absorbed in the charge transporting layer can be used for the current generation.

Figure 18:
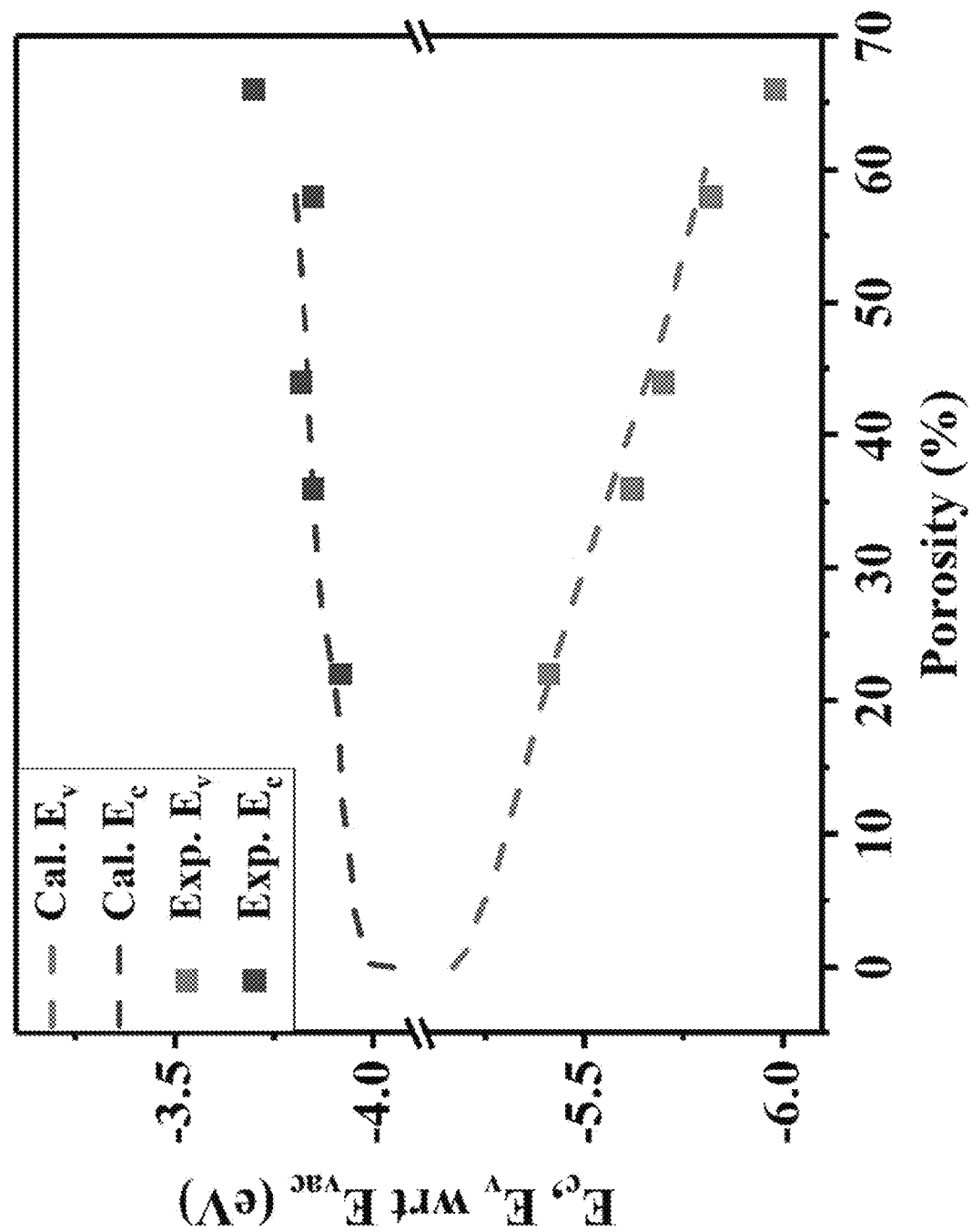
FIG. 18 shows the variation of conduction band minimum (CBM, $E_{cPS}$) and valence band maximum (VBM, $E_{vPS}$) with porosity of porous silicon (PS)

Since using surface modification, such as formation of pores in silicon, i.e., forming porous silicon (PS), the position of the conduction band minimum (CBM) and the valence band maximum (VBM) shifted with the porosity of porous silicon (PS). The shift in the energy levels of the conduction band minimum (CBM) and the valence band maximum (VBM) of porous silicon (PS) are in an approximate ratio of 1/2.6, e.g., 1 to at least 2.25, 2.3, 2.33, 2.35, 2.4, 2.45, 2.5, 2.525, 2.55, 2.575, 2.6, 2.625, or 2.65 and/or up to 2.9, 2.85, 2.8, 2.775, 2.75, 2.725, 2.7, 2.675, 2.65, 2.625, 2.6, 2.575, or 2.55. The position of the Fermi energy level remains roughly constant with increasing porosity, which indicates that the n-type character of the porous silicon (PS) layer increases with the increase of porosity. The dependency of the conduction band minimum (CBM) and the valence band maximum (VBM) of porous silicon (PS) is shown in FIG. 18. A semiconductor can work as an efficient electron-transport material (ETM) if energy levels of both the conduction band minimum (CBM) and the valence band maximum (VBM) have lower values than the lowest energy unoccupied molecular orbital (LUMO) and the highest energy occupied molecular orbital (HOMO) of the perovskite (PVT), respectively.

Figure 19A:
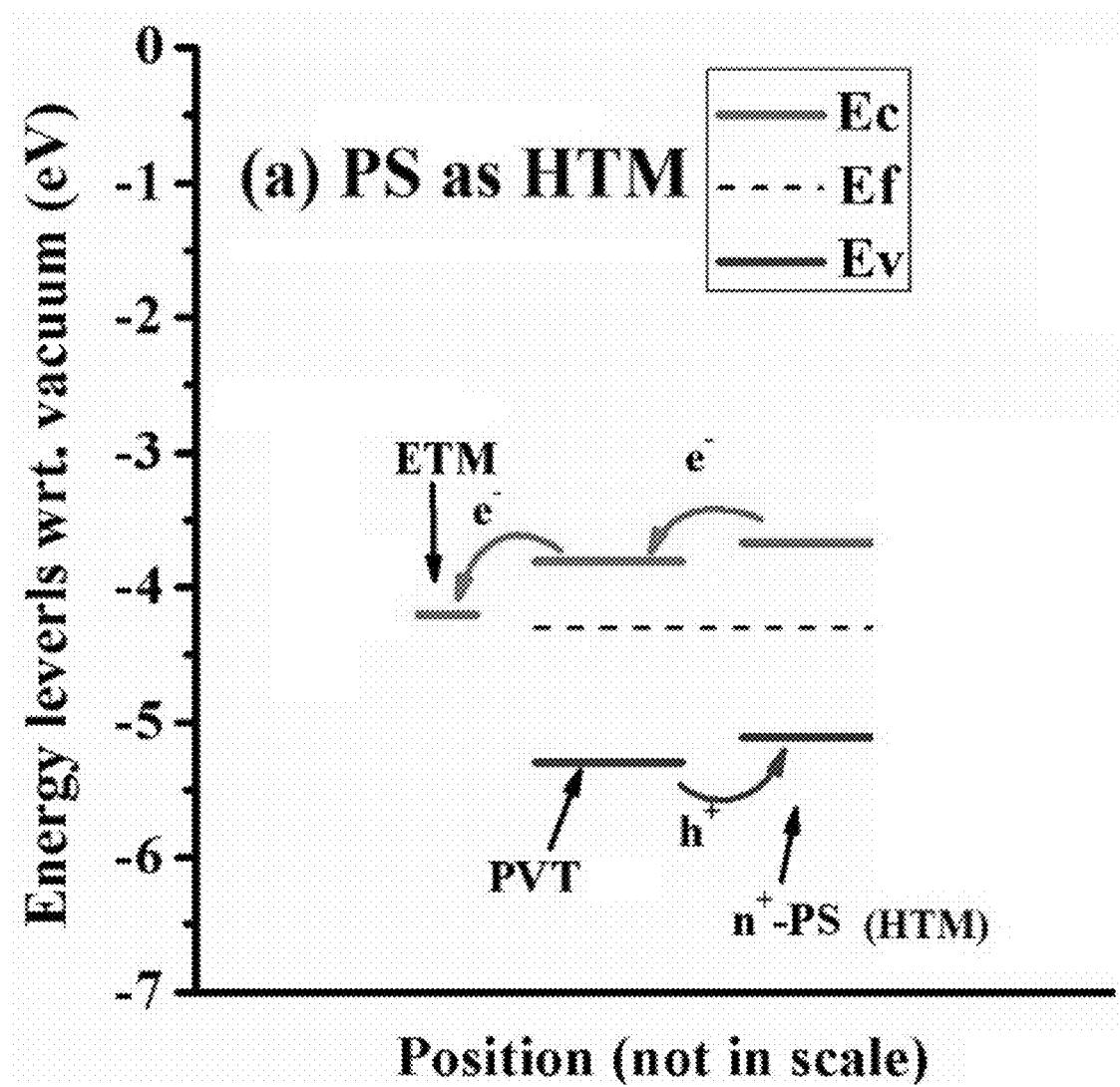
FIG. 19A shows the mechanism of $n^+$-porous silicon (PS) layer as a hole-transport material (HTM) and an electron-transport material (ETM)
Figure 19B:
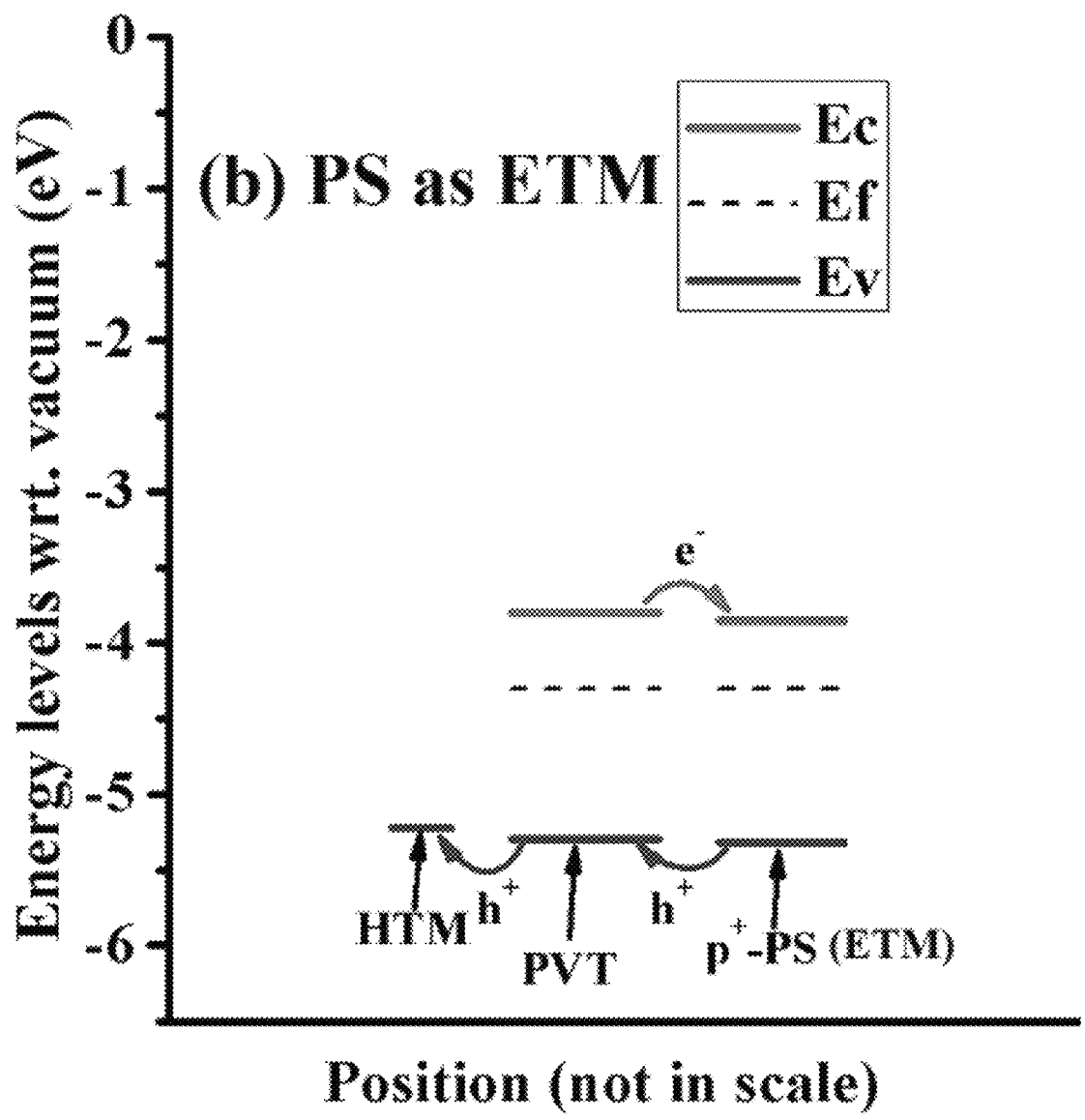
FIG. 19B shows the mechanism of $p^+$-porous silicon (PS) layer as a hole-transport material (HTM) and an electron-transport material (ETM)

P-type porous silicon (p-PS) can be used as electron-transport material (ETM), and n-type porous silicon (n-PS) layer can be used as hole-transport material (HTM) for perovskites (PVTs). The mechanism of p-type porous silicon (p-PS) as electron-transport material (ETM) and n-type porous silicon (n-PS) as hole-transport material (HTM) are shown in FIGS. 19A and 19B, respectively.

In prior perovskite (PVT)-silicon structures, several interfacial layers were used to tunnel the light-generated charge carriers. Most of the interfacial layers used in the perovskite (PVT)-silicon tandem structure themselves absorbed the incident photons corresponding to their optical bandgaps but the photons absorbed in the interfacial layers between perovskite (PVT) and silicon were unable to generate the charge carriers (electrons-holes). Thus, the short circuit current density ($J_{sc}$) was low. Moreover, the interfacial layers increase the series resistance of the device, which results in the reduction of the fill factor (FF). Multiple interfacial layers may also cause recombination losses. Therefore, the efficiency achieved by prior tandem solar cells was lower than the silicon mono-junction, i.e., the processing and material cost was doubled, but the overall efficiency was lower than the Si solar cell.

Figure 20:
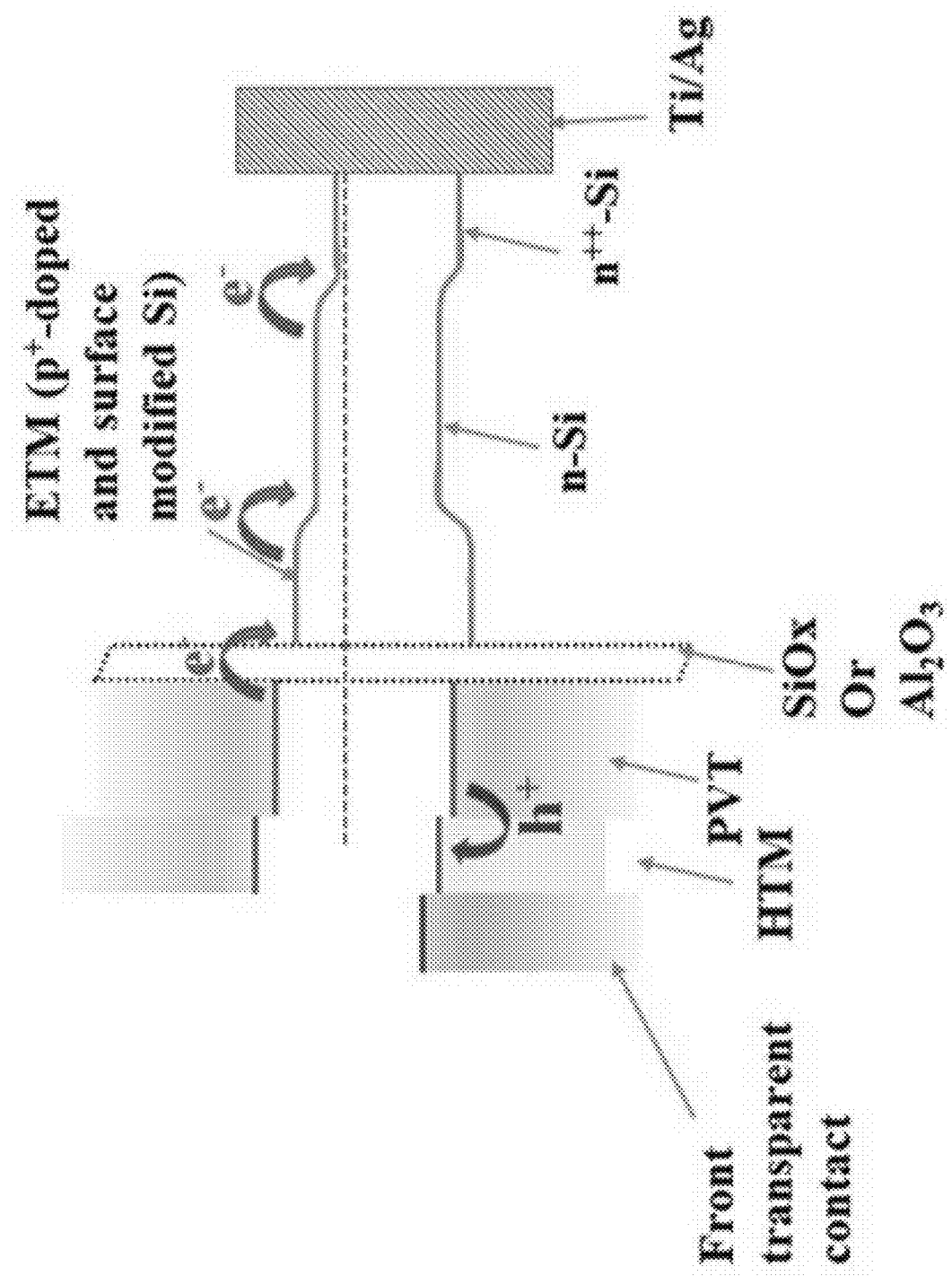
FIG. 20 shows an exemplary perovskite (PVT)-silicon tandem solar cell structure on n-type silicon wafer with the conduction band minimum (CBM, $E_{cPS}$) and valence band maximum (VBM, $E_{vPS}$) values being tuned by controlling the porosity of the silicon surface which can directly extract the electron from the perovskite (PVT) top solar cell.
Figure 21:
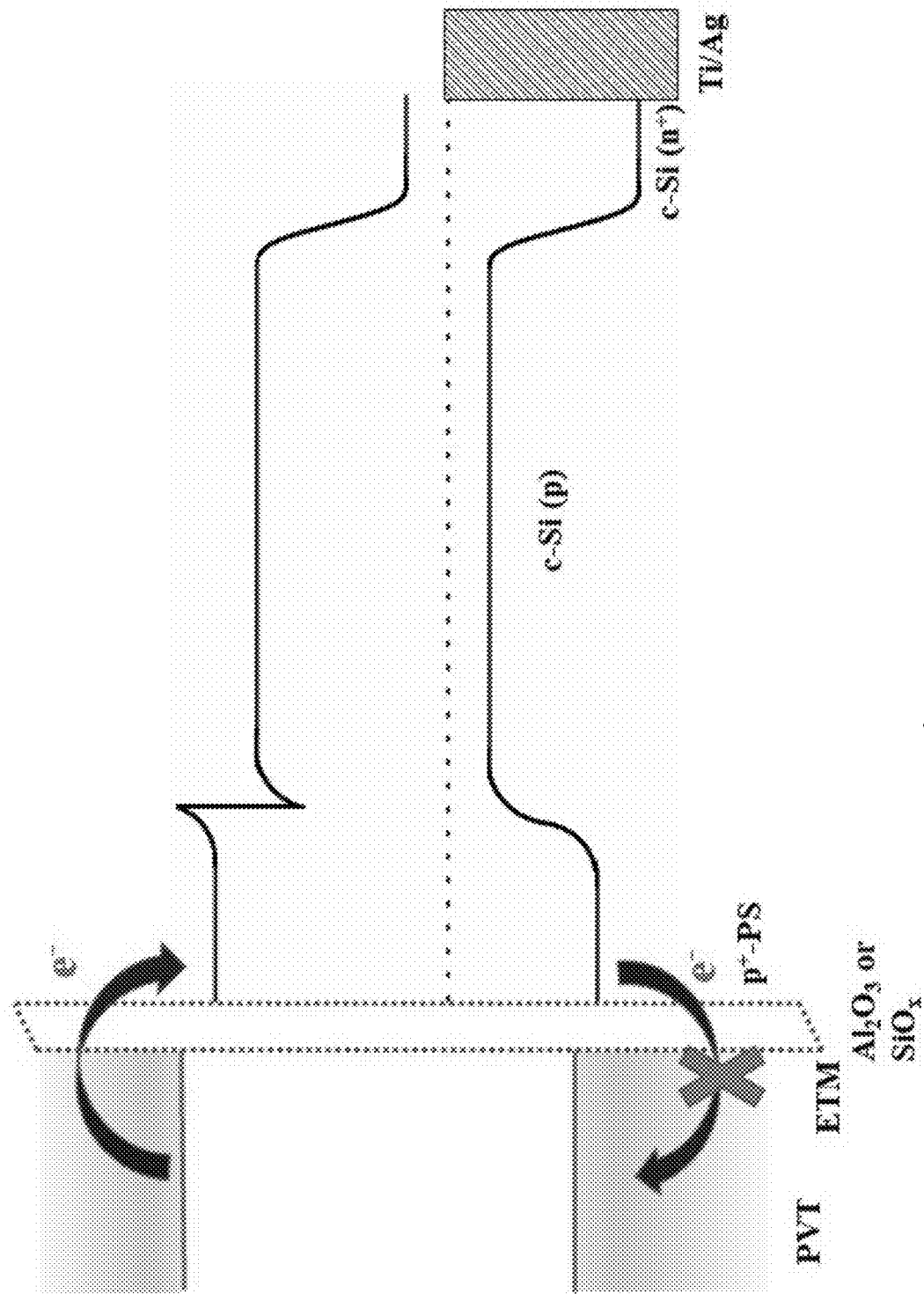
FIG. 21 shows an exemplary perovskite (PVT)-silicon tandem solar cell structure on p-type silicon wafer.

In this regard, aspects of the present disclosure avoid and/or eliminate interfacial layers. Inventive structures for PVT/Si tandem solar cells may use n-type silicon wafers and/or p-type silicon wafers. The realization of perovskite (PVT)-silicon (Si) tandem devices on n-type and p-type Si is shown in FIGS. 20 and 21. The schematics of n-type and p-type wafer-based monolithic PVT/Si tandem solar cell structures indicate that the n-type or p-type silicon wafers may be sandwiched between a n-doped silicon layer and p-doped, optionally porous silicon layer.

Aspects of the present disclosure provide tuning of the conduction and valence band edge, e.g., at the front surface, by surface modification. Aspects of the present disclosure include implementing modified silicon surfaces as electron-transporting materials (ETM). Aspects of the present disclosure include using $Al_2O_3$ or $SiO_x$, e.g., silicon oxide(s), as a hole blocking and silicon passivating layer. Aspects of the present disclosure provide adjusting/tuning the thickness and optical bandgap of the perovskite layer for current matching between the perovskite top sub-cell and Si bottom cell. Aspects of the present disclosure comprise highly diffused $n^{++}$ junctions formed on the rear surface of silicon.

Aspects of the present disclosure allow the omission of several processing steps relative to known devices/methods. Aspects of the present disclosure comprise the absorption of long-wavelength photons near the p-n junction, thereby increasing the collection efficiency. Aspects of the present disclosure provide reduce parasitic absorption losses due to interface layers. Aspects of the present disclosure include enhanced current densities for tandem cells.

Aspects of the present disclosure comprise reducing resistive loss, e.g., by charge carriers directly entering into the silicon. Aspects of the present disclosure remove several interfacial layers, which may allow optical, recombination, and/or resistive losses to be reduced. Aspects of the present disclosure enhance the open circuit voltage ($V_{oc}$), e.g., via surface modification of silicon, optionally further enhancing the open circuit voltage ($V_{oc}$) of the tandem cell.

Aspects of the present disclosure may provide conversion efficiencies in inventive tandem solar cell of ~28%, e.g., at least 22, 22.5, 23, 23.5, 24, 24.5, 25, 25.5, 26, 26.5, 27, 27.5, or 28% and/or up to 33, 32.5, 32, 31.5, 31, 30.5, 30, 29.5, 29, 28.5, 28, 27.5, or 27%. Aspects of the invention increase the stability of the device relative to known arrangements. In particular the performance relates stability of the perovskite solar cell against degradation under moisture environment. Dimensional and performance stability is such that the solar cell output between two humidity conditions (e.g., humidity measured as values that are at least 80% RH apart, preferably at least 70% RH apart, 60% RH apart) does not differ by more than 0.005 V, preferably 0.01V, 0.1 V or IV when all other conditions are help the same. Aspects of the invention include reducing solar energy costs, e.g., by up to 10, 7.5, 5, 4, 3, 2.5, 2, 1.5, or 1% over present prices.

The prophetic results (bottom row) of the structures of the present disclosure are compared with known structures in Table 1. An η of greater than 28% can be achieved by accomplishing the values of short circuit current density ($J_{sc}$), open circuit voltage ($V_{oc}$), and fill factor (FF) as listed in Table 2.

TABLE 1

A comparison of the monolithic perovskite (PVT)-silicon tandem cell of the proposed concept with the previously reported.

| Structures | Front texture/ ARC | ETM/HTM | Monolithic PVT/Si tandem cell η (%) |
|---|---|---|---|
| PVT(n-i-p, planar)/ homo-junction c-Si | Texture polymer | TiO$_2$/Spiro-OMeTAD | 22.5 |
| PVT(p-i-n, planar)/HIT | LiF ARC | PCBM/NiO | 23.6 |
| PVT(p-i-n, planar)/HIT | Texture metal foil | C$_{60}$/PTTA | 25.5 |
| PVT(p-i-n, planar)/HIT | LiF ARC | PCBM/NiO | 25.2 |
| PVT(p-i-n, planar)/HIT | LiF ARC | C$_{60}$/PTTA | 26.0 |
| PVT (p-i-n or n-i-p)/homo-junction Si | LiF ARC | PS/NiO | >28.0 |

TABLE 2

Expected values of performance parameters using the inventive concept.

| $J_{sc}$ (mA/cm$^2$) | $V_{oc}$ (V) | FF (%) | η (%) |
|---|---|---|---|
| 20 | 1.80 | 78.0 | 28.08 |

Inventive structures may achieve a short-circuit current density ($J_{sc}$) of, e.g., at least 15, 15.5, 16, 16.5, 17, 17.5, 18, 18.5, 19, 19.5, 20, 20.5, 21, 21.5, 22, or 22.5 mA/cm$^2$ and/or up to 25, 24.5, 24, 23.5, 23, 22.5, 22, 21.5, 21, 20.5, 20, 19.5, or 19 mA/cm$^2$. Inventive structures may achieve an open circuit voltage ($V_{oc}$) of, e.g., at least 1.3, 1.35, 1.4, 1.45, 1.5, 1.55, 1.6, 1.65, 1.7, 1.75, 1.8, 1.85, 1.9, 1.95, or 2 V and/or up to 2.3, 2.25, 2.2, 2.15, 2.1, 2.05, 2, 1.95, 1.9, 1.85, 1.8, or 1.75 V. Inventive structures may achieve a fill factor (FF) of, e.g., at least 70, 71, 72, 72.5, 73, 74, 75, 76, 77, 77.5, 78, 79, or 80% and/or up to 85, 84, 83, 82.5, 82, 81.5, 81, 80.5, 80, 79.5, 79, 78.5, 78, or 77.5%.

Referring now to the drawings, wherein like reference numerals designate identical or corresponding parts throughout the several views.

FIG. 1A shows a monolithic multi-junction solar cell having only two terminals in which two or more single-junction solar cells are electrically series-connected via tunnel junction or recombination layer as shown in.

Figure 1B:
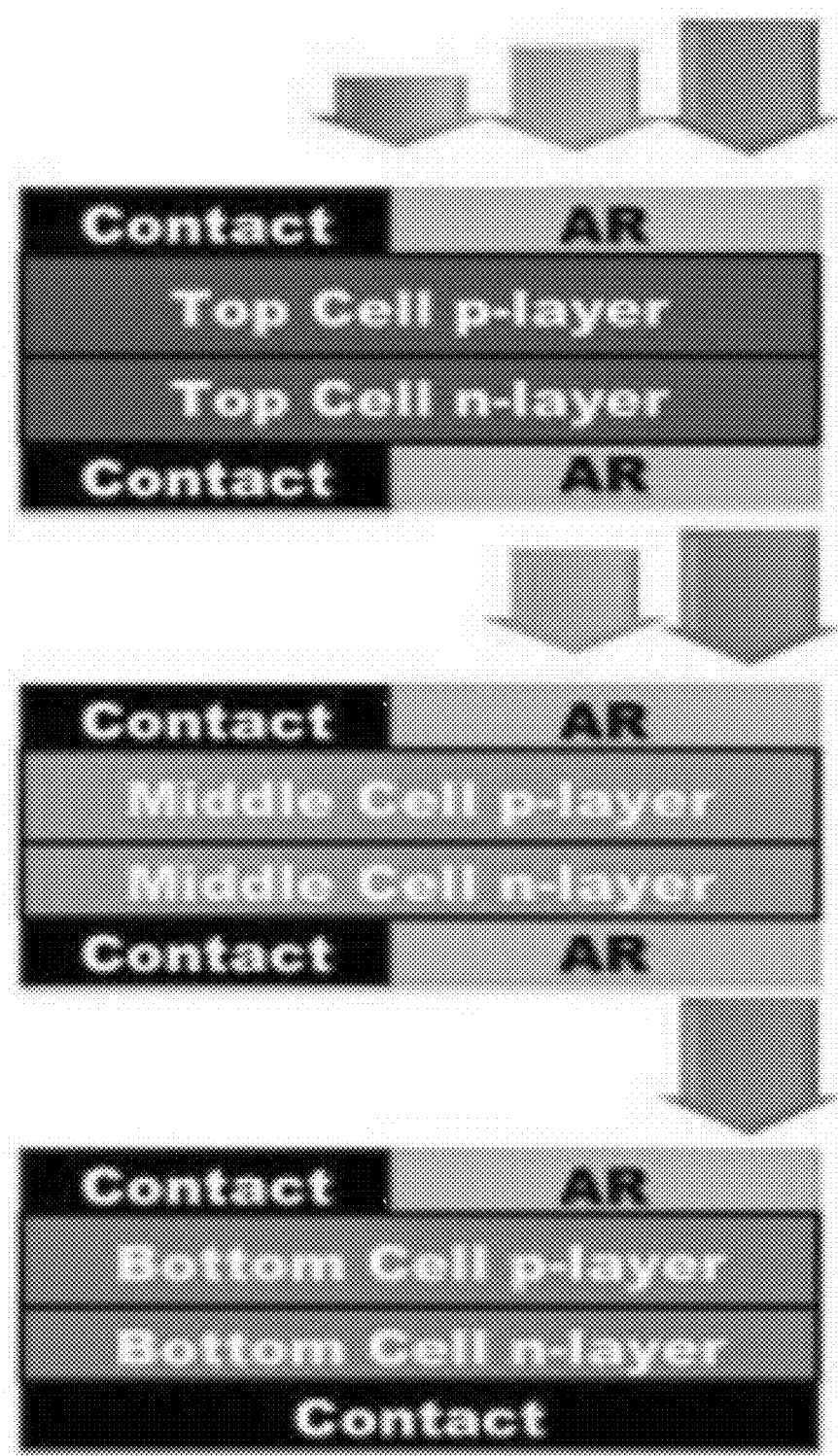
FIG. 1B shows a schematic of a mechanically stacked (multi-terminal) multi-junction solar cell as described in the Khan Ph.D. thesis, Jamia Millia Islamia, New Delhi, India (2012)

FIG. 1B shows a mechanically stacked multi-junction solar cell, having multi-terminals, i.e., 2-fold the number of single-junction solar cells, in which two or more single-junction solar cells just mechanically stacked, but not internally connected via tunnel junction.

Figure 2A:
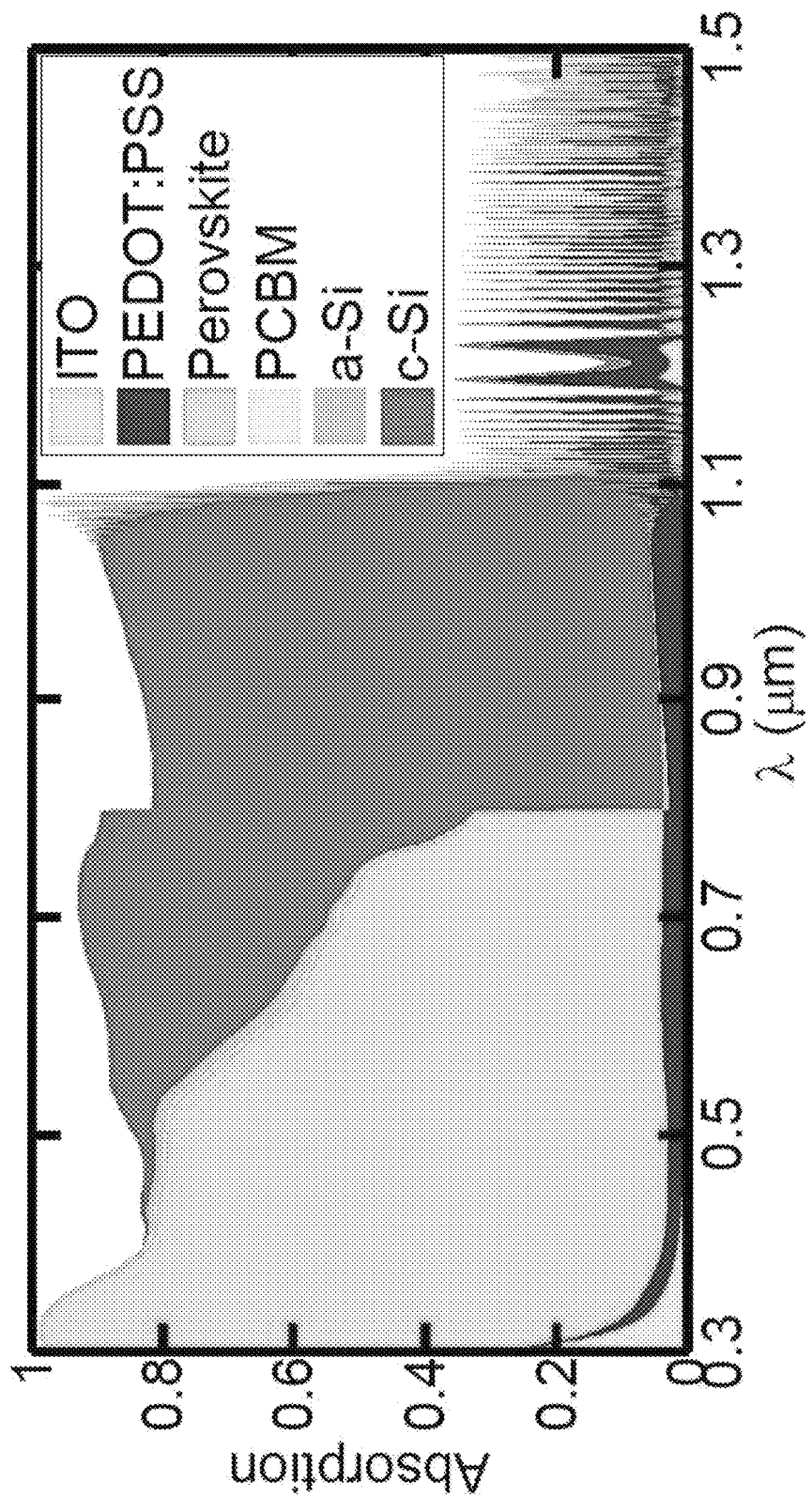
FIG. 2A shows an absorption spectrum of optimum-thickness traditional tandem solar cell as described in *Appl. Phys. Lett.* 2015, 106, 243902.
Figure 2B:
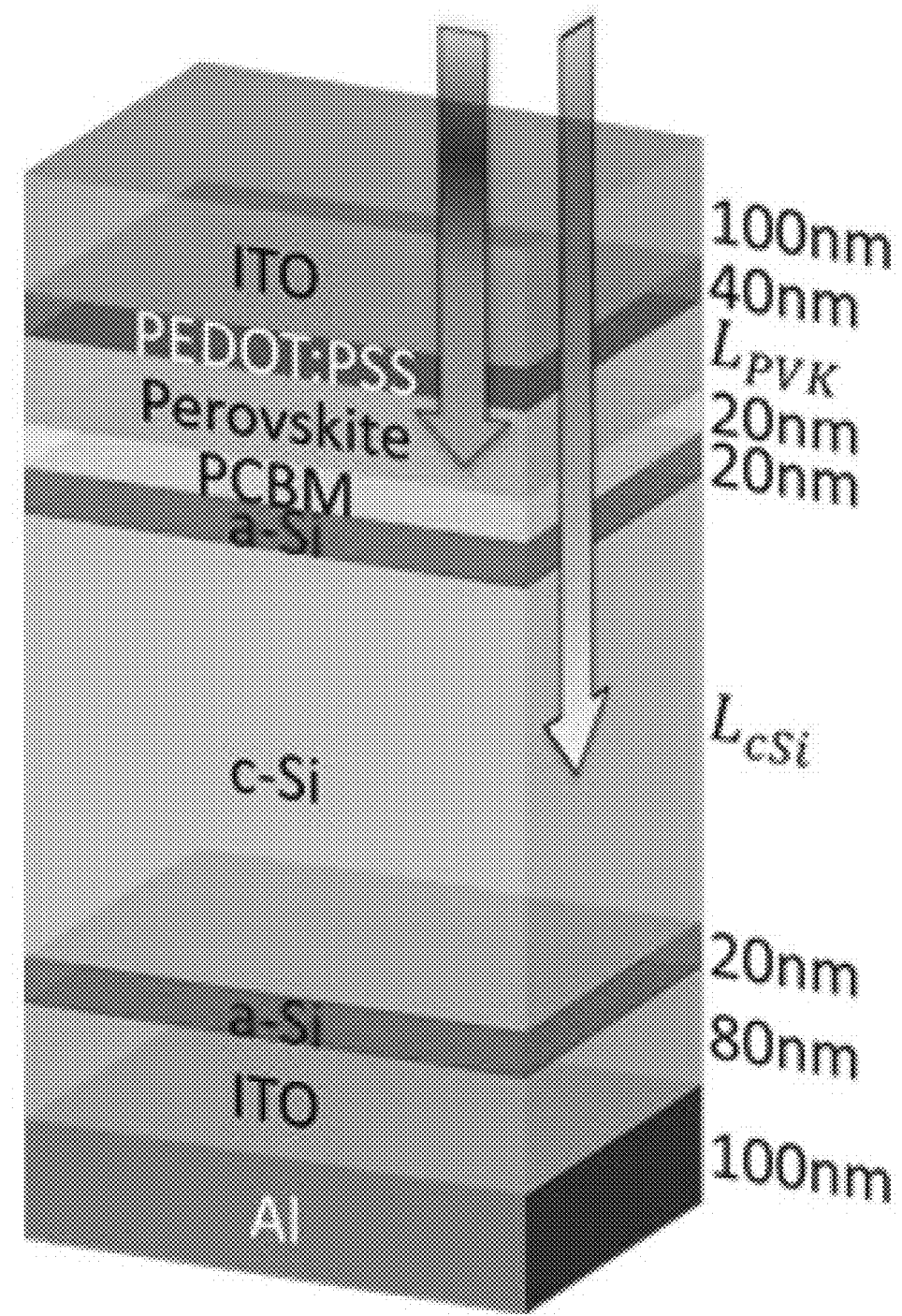
FIG. 2B shows the traditional tandem solar cell as described in *Appl. Phys. Lett.* 2015, 106, 243902.

FIGS. 2A and 2B show perovskite (PVT)-based tandem solar cells having two sub-cells with the perovskite (PVT) being the top cell along and silicon or CIGS (CuInGaSe) as the bottom cell. The top cell can absorb solar radiation up to 800 nm, while the bottom cell can absorb the remaining part up to a cut-off wavelength, e.g., $\lambda_g \approx 1240/E_g$ in nm, of the bottom cell material, which can be observed in FIG. 2B.

Figure 3:
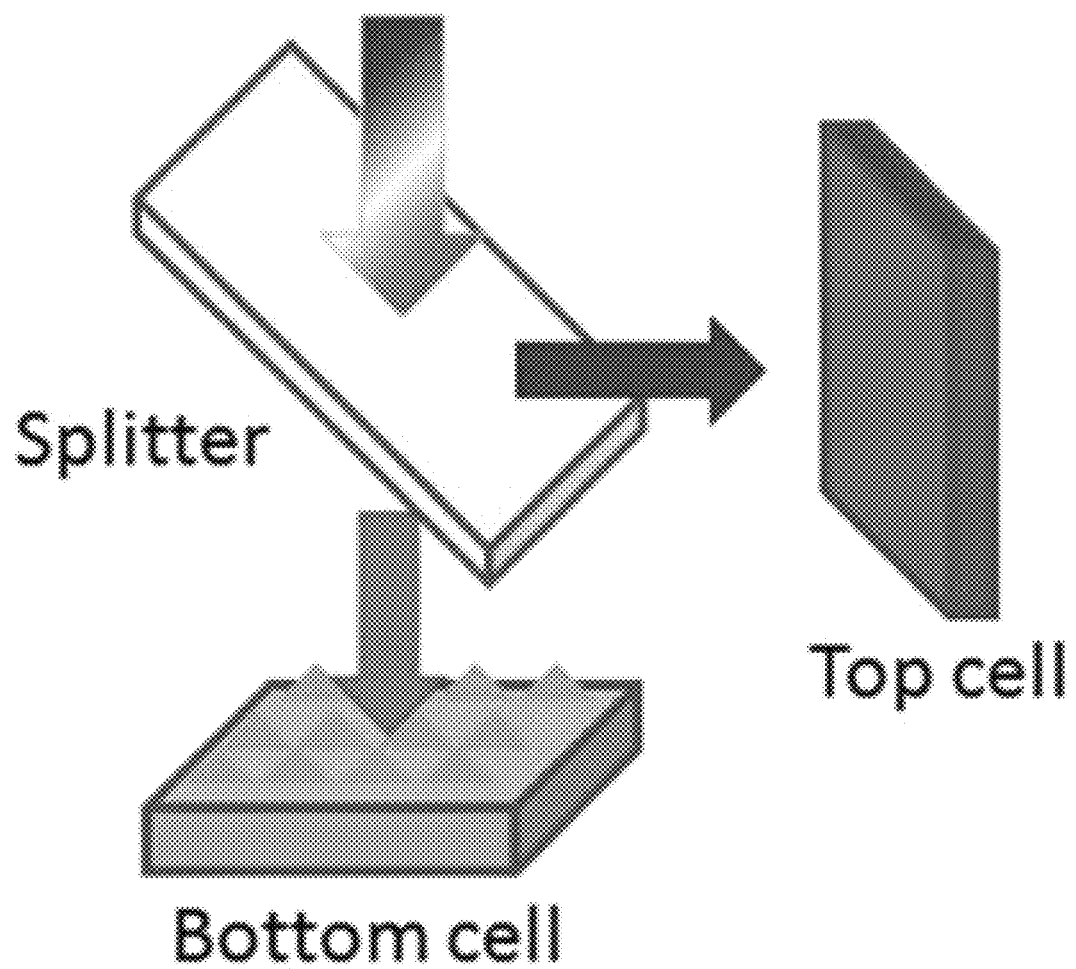
FIG. 3 shows a schematic diagram of a four-terminal photovoltaic device using a spectrum splitting technique as described in *Appl. Phys. Lett.* 2015, 106, 013506.

FIG. 3 shows an arrangement from *Appl. Phys. Lett.* 2015, 106, 013506 (Uzu) using an external optical splitting system positioned at 45° to split the solar spectrum at a cut-off wavelength of 550 nm, 600 nm, and 640 nm to enhance the resultant efficiency (η) of the combined cell. The short wavelength solar radiation is reflected to top cell, whereas, the long wavelength radiation is transmitted to the bottom cell.

Figure 4:
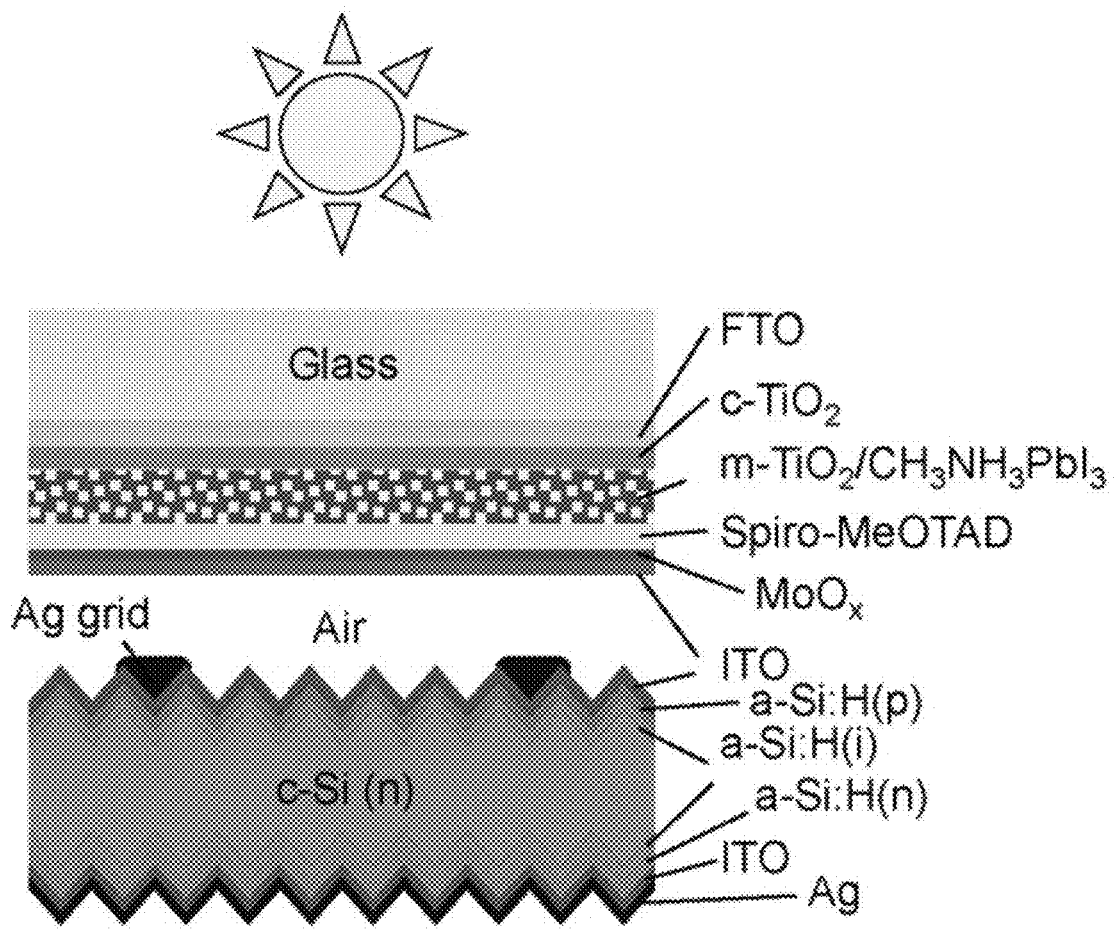
FIG. 4 shows a schematic diagram of mechanically stacked four terminals tandem cell as described in *Phys. Chem. Chem. Phys.* 2015, 77, 1619-1629.

FIG. 4 shows a structure from *Phys. Chem. Chem. Phys.* 2015, 77, 1619-1629 using mechanically stacked four-terminal systems using CH$_3$NH$_3$PbI$_3$-based PSC with fluorine-doped tin oxide (FTO) at front contact and MoO$_x$ as transparent back contact (η=11.6%) and SJH as the bottom cell as seen in. In this case, the combined η is enhanced to 13.4%.

Figure 5:
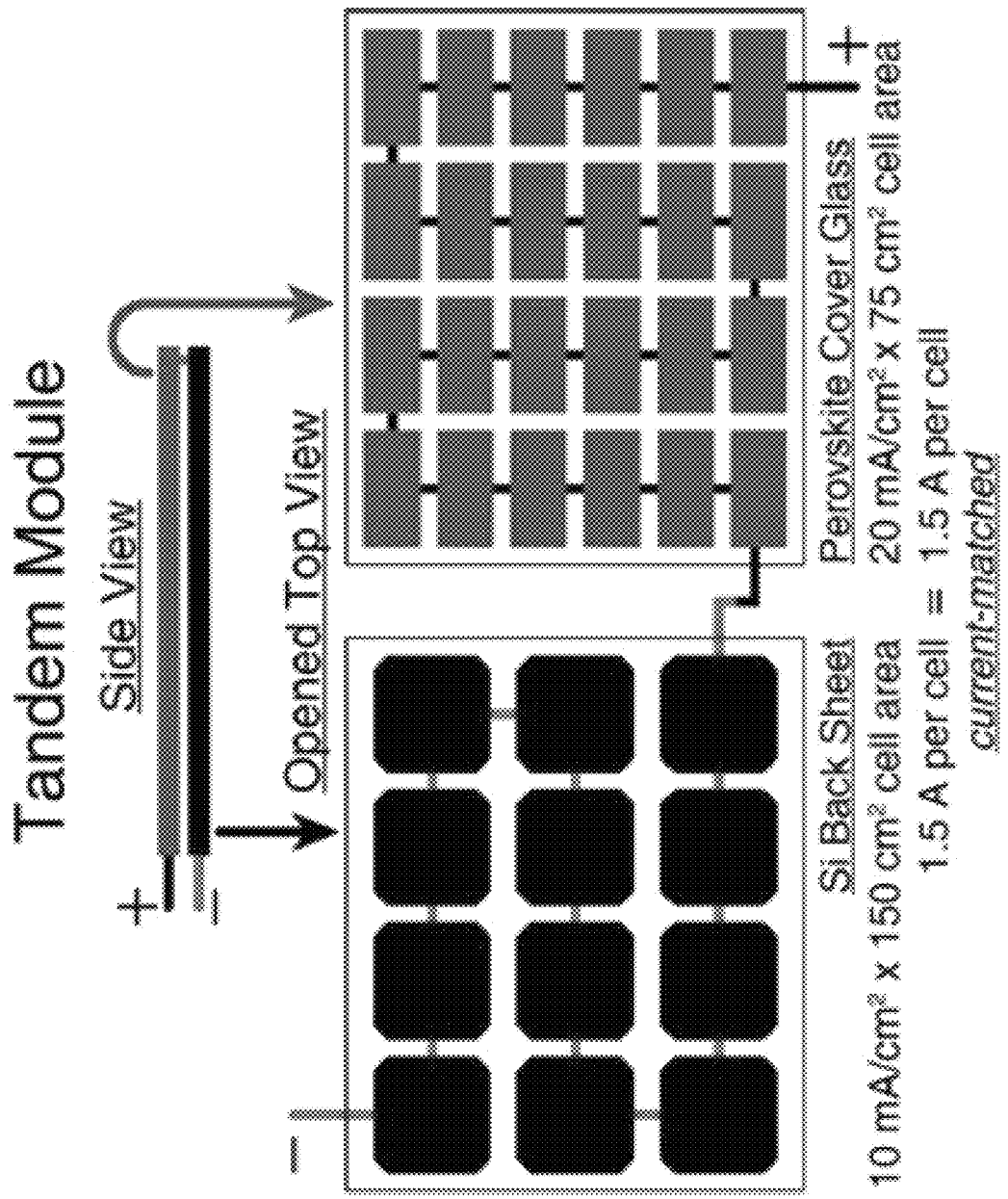
FIG. 5 shows a schematic diagram of current matched solar modules as described in *Ener. Env. Sci.* 2015, 8, 956-963.

FIG. 5 shows a structure from *Ener. Env. Sci.* 2015, 8, 956-963 (Bailie) with a transparent solar module of CH$_3$NH$_3$PbI$_3$-based PSC (FTO on front contact and silver nanowire back contact) as top solar module with total current (current density, $J_{sc}$=20 mA/cm$^2$ and total area=75 cm$^2$) and Si solar module on bottom (short circuit current density ($J_{sc}$)=10 mA/cm$^2$ and total area=150 cm$^2$). In this type of structure, both the solar module produced an equal current of 1.5 A.

Figure 6A:
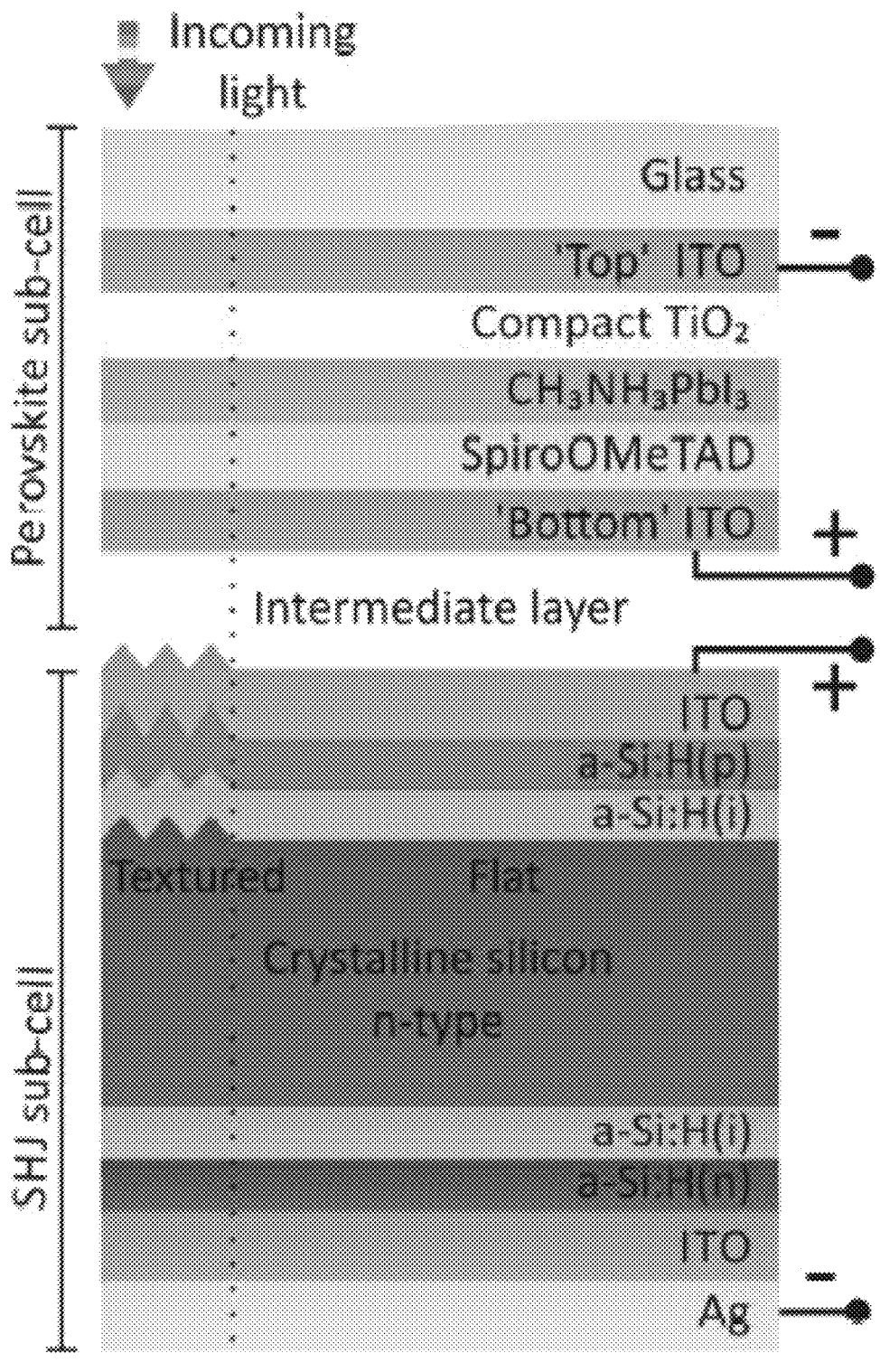
FIG. 6A shows a schematic representation of the simulated architecture of a four-terminal device, where individual $CH_3NH_3PbI_3$ perovskite and silicon cells are optically stacked, and on the left side textured wafers (front surface) and layers are deposited on top by conformal growth as shown in *Opt. Exp.* 2015, 23, A263-A278.
Figure 6B:
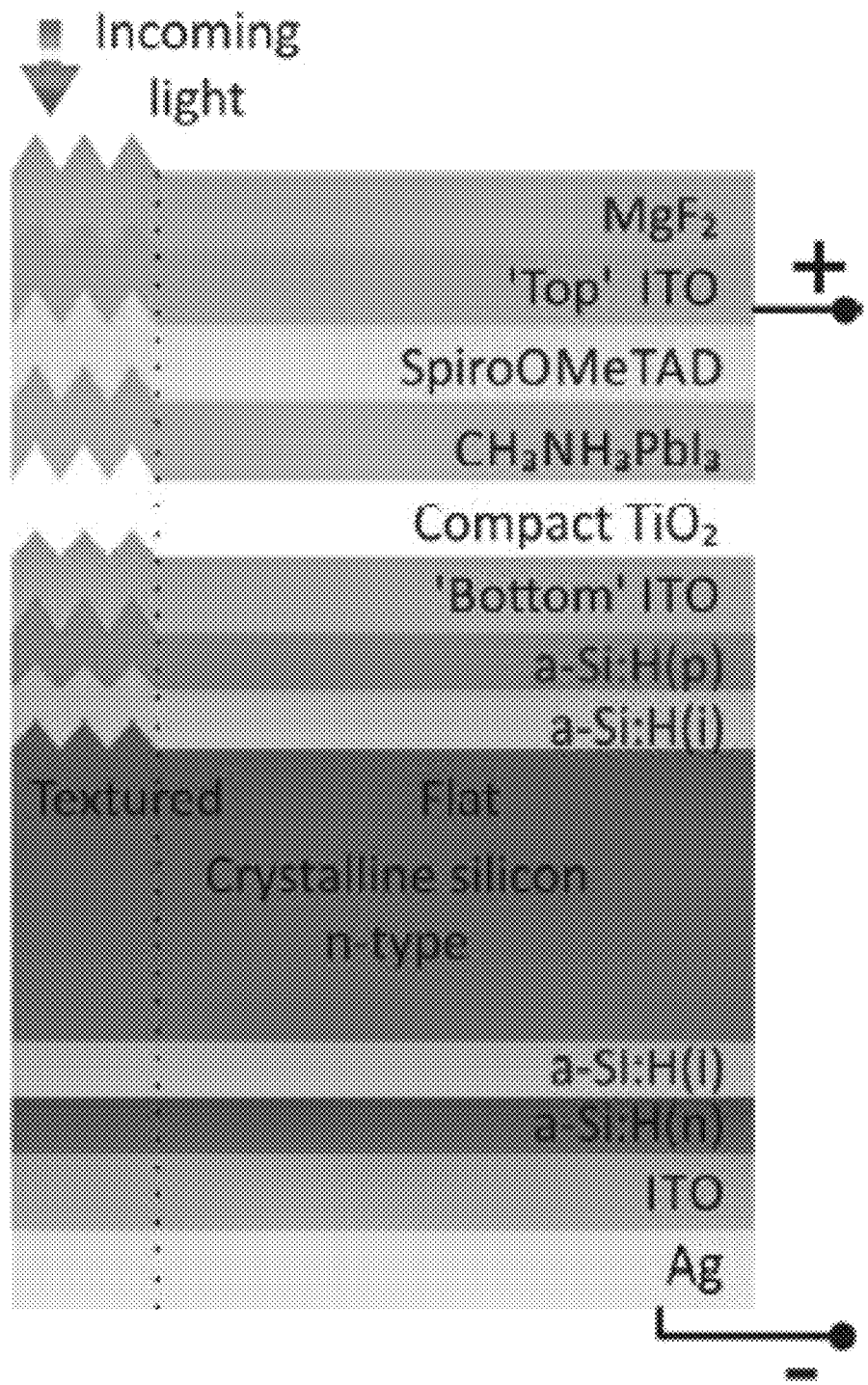
FIG. 6B shows a schematic representation of a simulated architecture of a two-terminal device with $CH_3NH_3PbI_3$ perovskite and silicon cells connected in series, wherein on the left side textured wafers (front surface) and layers are deposited on top by conformal growth as shown in *Opt. Exp.* 2015, 23, A263-A278.

FIGS. 6A and 6B show arrangements from *Opt. Exp.* 2015, 23, A263-A278 (Filipic) for simulating a CH$_3$NH$_3$PbI$_3$ perovskite solar on top of the planar and textured Si heterojunction (SHJ) using 2- and 4-terminals. The simulated η of two terminals and four terminals structures for flat and textured Si surfaces using a single-diode model are listed in Table 3.

TABLE 3

Estimated η of 2 and 4 terminals tandem configurations based on the one-diode model and simulated short circuit current density ($J_{sc}$) values from Filipic.

| Terminals | Structures | Perovskite cell η (%) | SHJ cell η (%) | Tandem cell η (%) |
|---|---|---|---|---|
| 4 | Constrained Flat | 16.4 | 11.1 | 27.5 |
| 4 | Unconstrained Flat | 19.2 | 9.8 | 29.1 |
| 4 | Constrained Textured | 16.3 | 12.1 | 28.4 |
| 4 | Unconstrained Textured | 19.2 | 11.0 | 30.1 |
| 2 | Constrained Flat | 14.5 | 10.9 | 25.4 |
| 2 | Unconstrained Flat | 17.3 | 12.9 | 30.2 |

TABLE 3-continued

Estimated η of 2 and 4 terminals tandem configurations based on the one-diode model and simulated short circuit current density ($J_{sc}$) values from Filipic.

| Terminals | Structures | Perovskite cell η (%) | SHJ cell η (%) | Tandem cell η (%) |
|---|---|---|---|---|
| 2 | Constrained Textured | 15.2 | 11.7 | 26.8 |
| 2 | Unconstrained Textured | 17.5 | 12.8 | 30.3 |

Filipic estimated the tandem cell η based on 4-terminals for a flat surface as 29.1% and for a textured surface as 30.1%. For 2-terminals, the maximum η was obtained for a flat surface of 30.2% and for a textured surface of 30.3%. Filipic indicates that ~1.1% η is enhanced after converting 4-terminal structure to 2-terminal structure for flat surface, while η is nearly the same for texture surface (Δη≈0.2%).

Figure 7A:
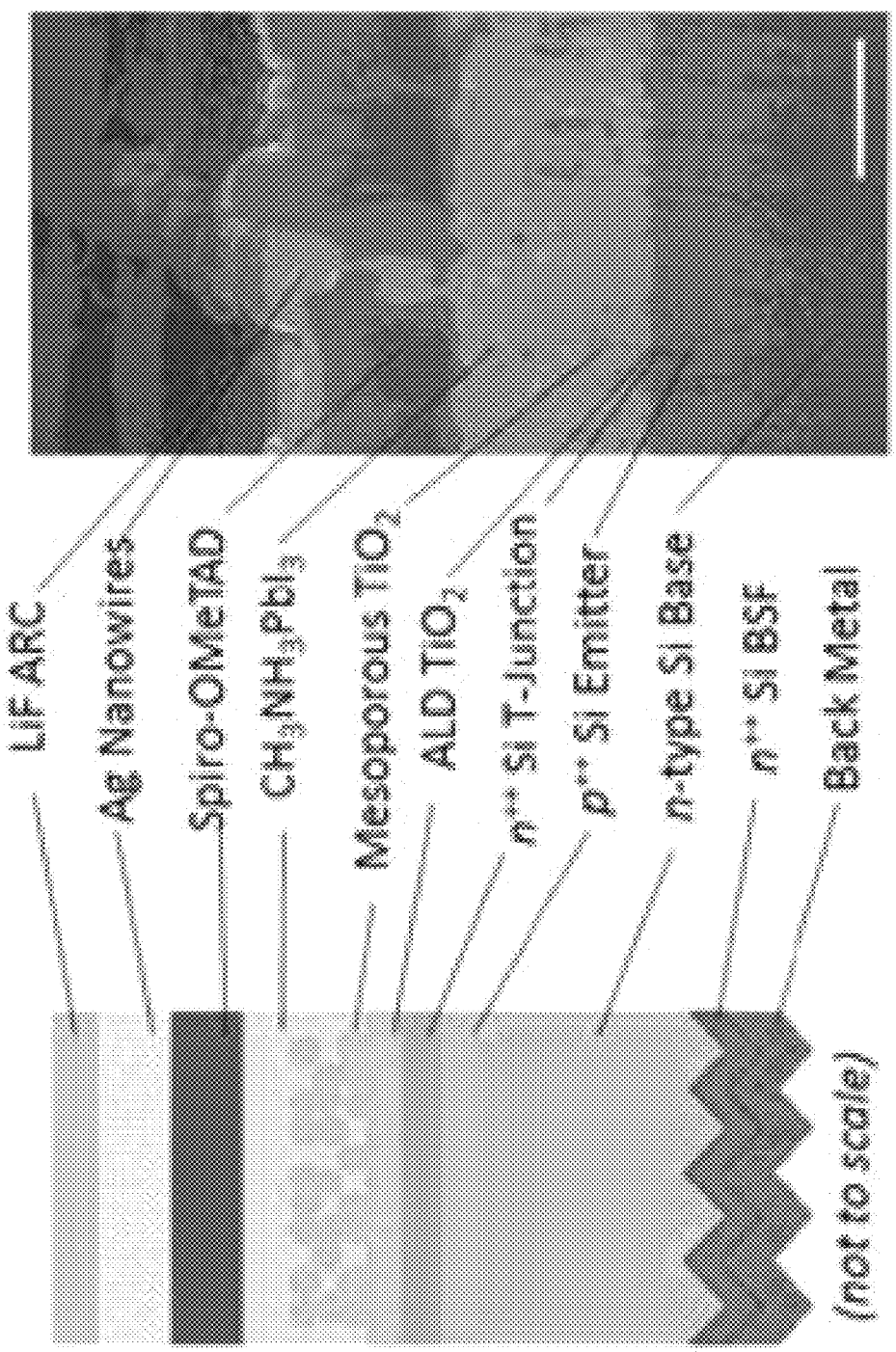
FIG. 7A shows a device structure of a two-terminal monolithically grown perovskite-silicon multijunction solar cell with an n-type silicon base. The polished SEM image is taken at 45° tilt to show the Ag nanowire mesh on 500 nm scale bar, as described in *Appl. Phys. Lett.* 2015, 106, 121105.
Figure 7B:
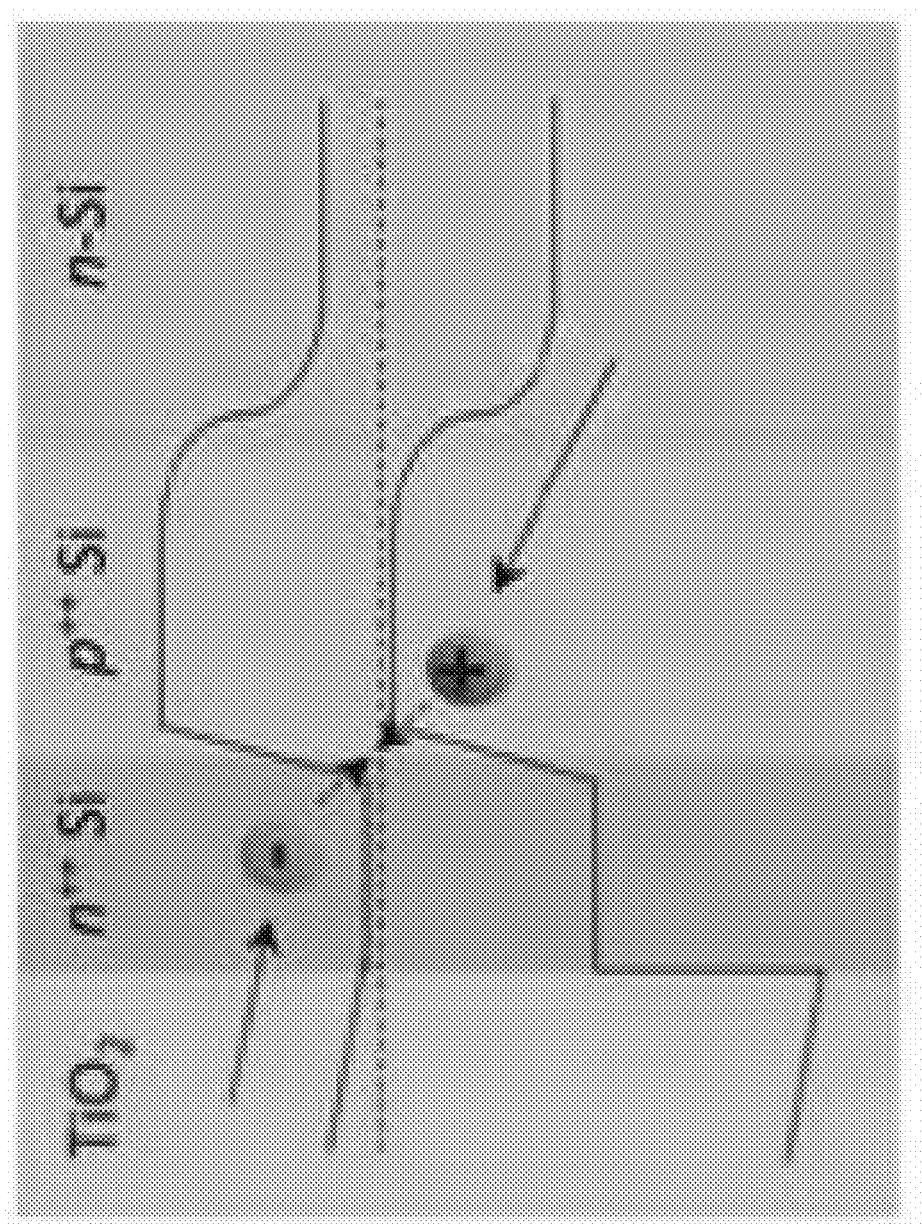
FIG. 7B shows a band diagram of the perovskite/silicon cell interface showing the charge-transport mechanism around the Si tunnel junction as described in *Appl. Phys. Lett.* 2015, 106, 121105.

FIGS. 7A and 7B show a structure from *Appl. Phys. Lett.* 2015, 106, 121105 (Mailoa) with a 2-terminal $CH_3NH_3PbI_3$ perovskite solar on top with p-n junction Si crystalline solar cell ($p^{++}$-Si/n-Si) along with $n^{++}$-Si tunnel (T) junction. The experimentally measured value of η was 13.7%.

Figure 8A:
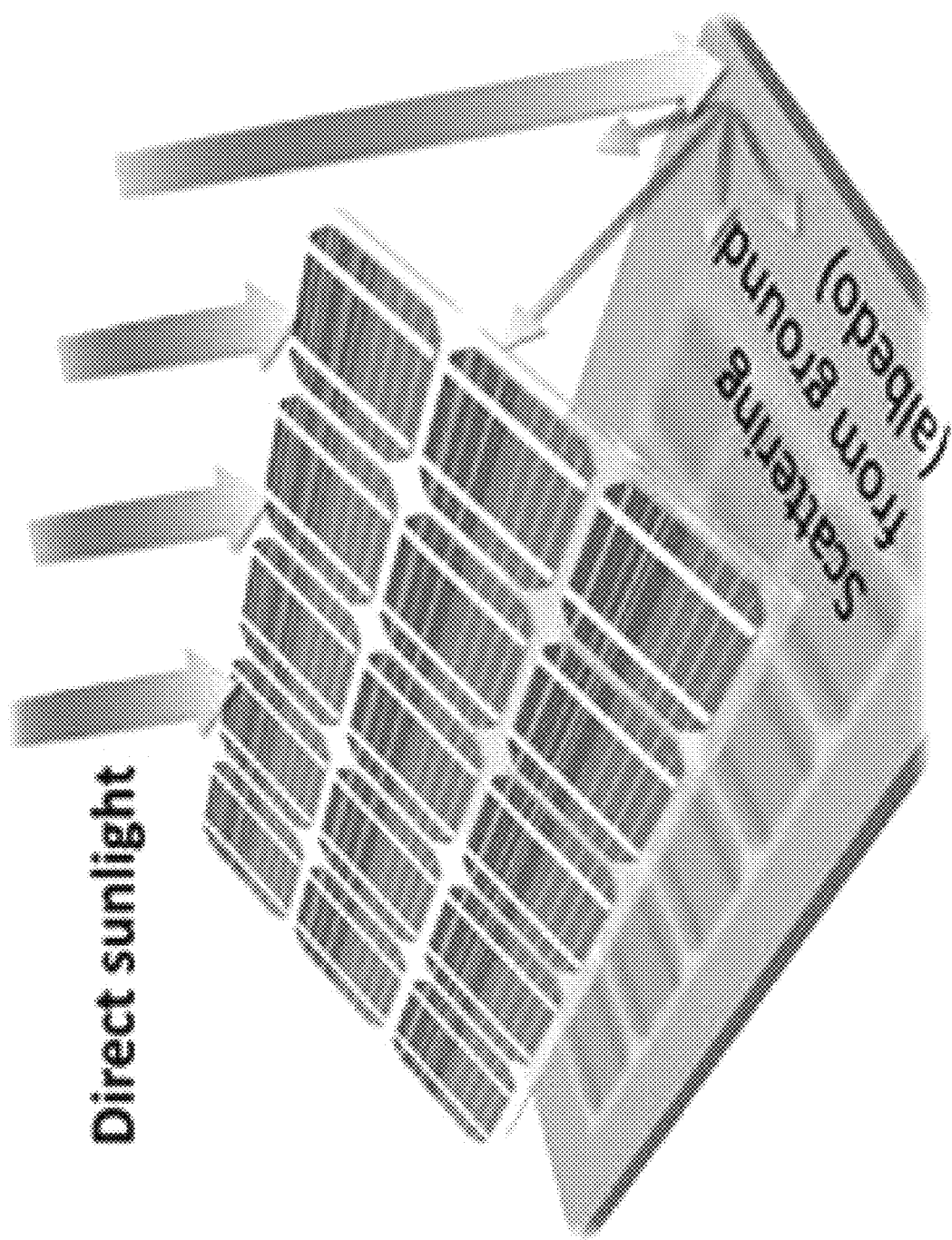
FIG. 8A shows a solar panel generally utilizes the direct illumination of sunlight, wherein a fraction of the light can be scattered from the ground onto the back of the panel, as described in *Appl. Phys. Lett.* 2015, 106, 243902.
Figure 8B:
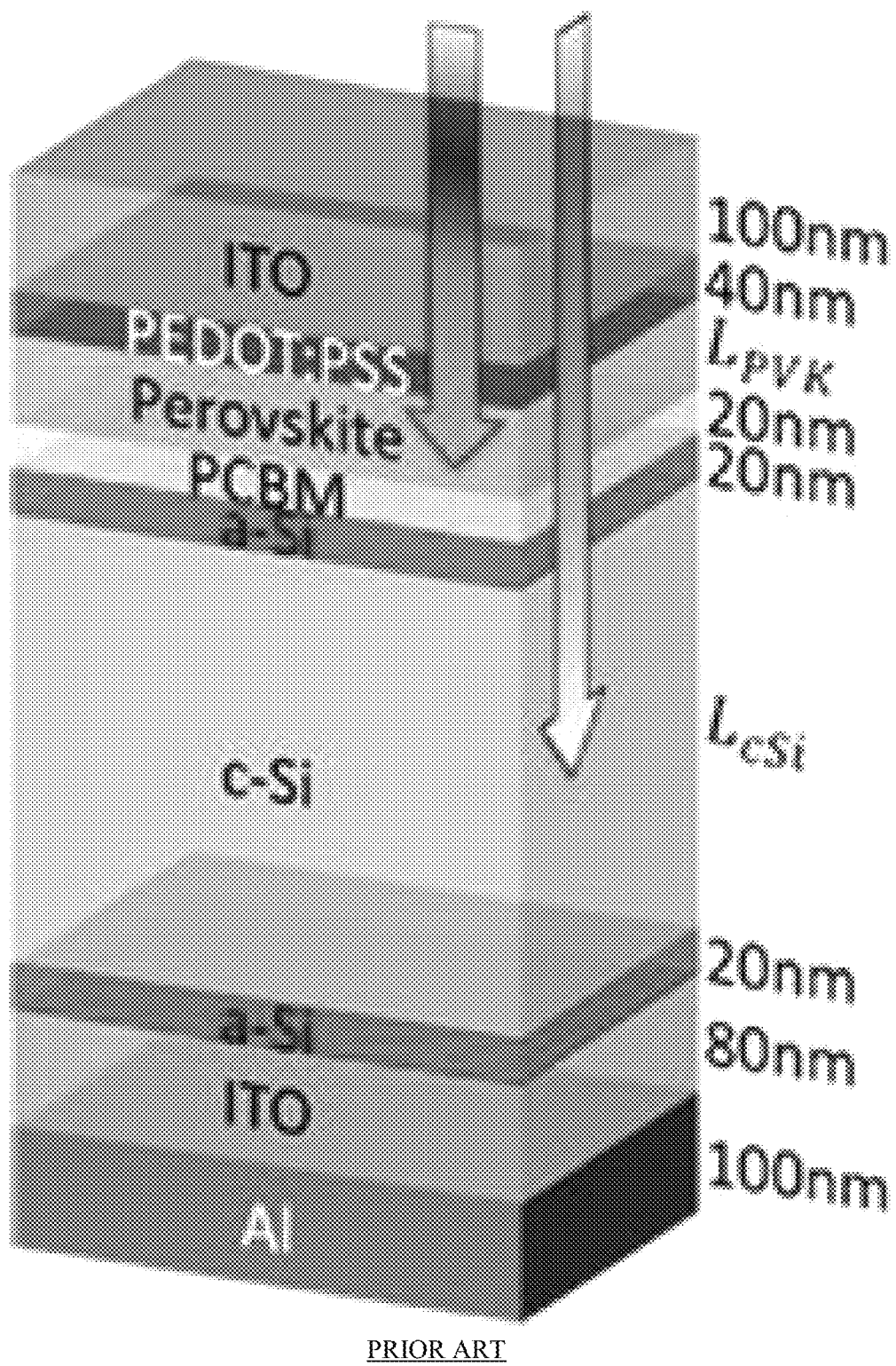
FIG. 8B shows a traditional tandem structure as described in *Appl. Phys. Lett.* 2015, 106, 243902.
Figure 8C:
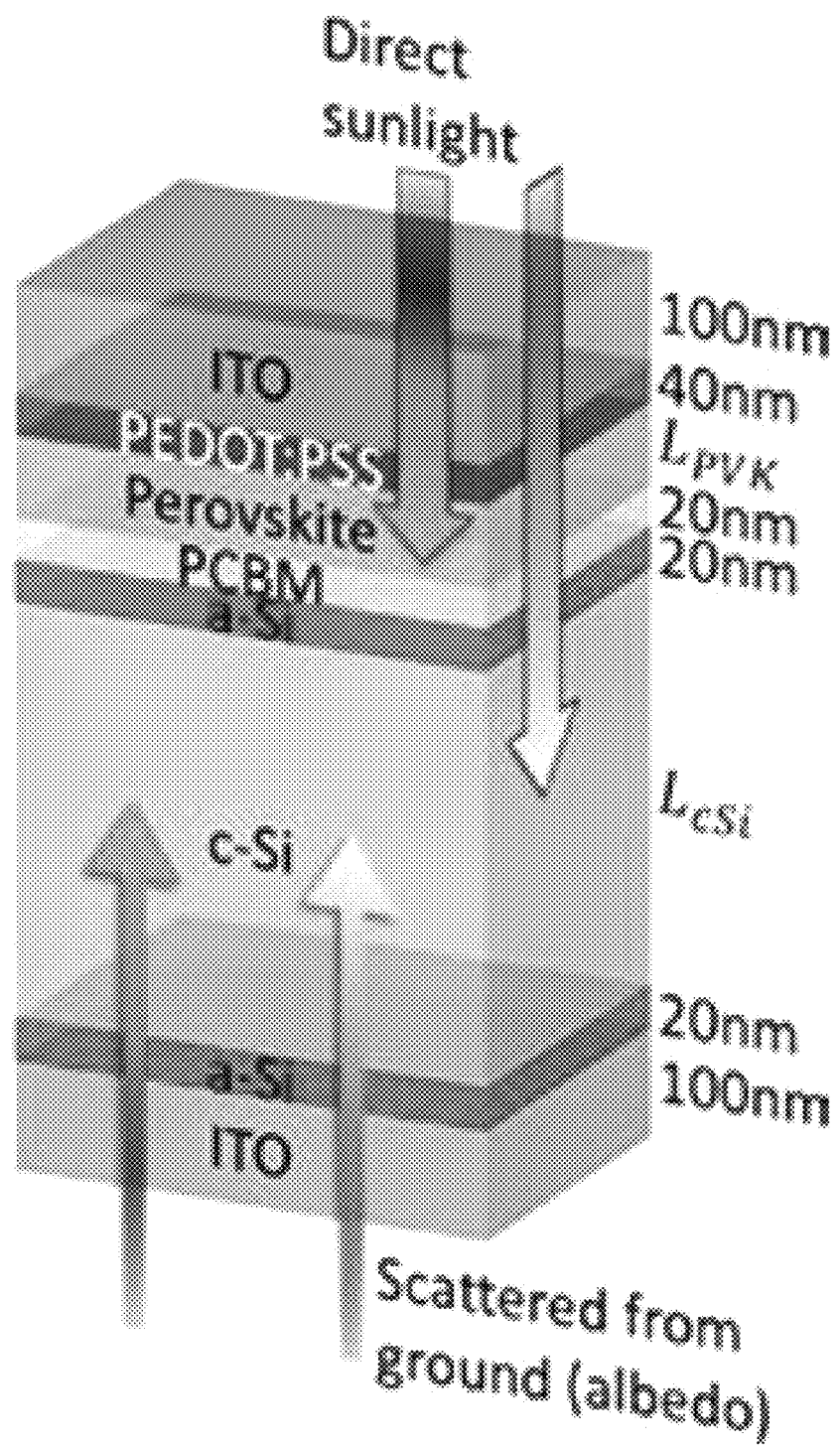
FIG. 8C shows a bifacial tandem structure as described in *Appl. Phys. Lett.* 2015, 106, 243902.

FIG. 8A to 8C show an arrangement from *Appl. Phys. Lett.* 2015, 106, 243902 (Asadpour) with a bifacial Si heterojunction (SJH)-perovskite tandem design decouples the optoelectronic constraints and provides an innovative path for improved η via scattered light from the ground (FIG. 8A). In the bifacial configuration, the same state-of-the-art sub-cells achieve a normalized output η of 33%, exceeding the bifacial heterojunction with an intrinsic thin layer (HIT) performance at practical albedo reflections. The traditional tandem cell consists of the higher band-gap perovskite ($E_g$≈1:55 eV) sub-structure stacked on top of the lower bandgap ($E_g$≈1:12 eV) c-Si heterojunction with an intrinsic thin layer (HIT)-sub-cell as seen in FIG. 8B. The bifacial tandem cell has a similar design except for the absence of an Al back contact. This allows the absorption of light reflected from the ground, as shown in FIG. 8C.

Figure 9A:
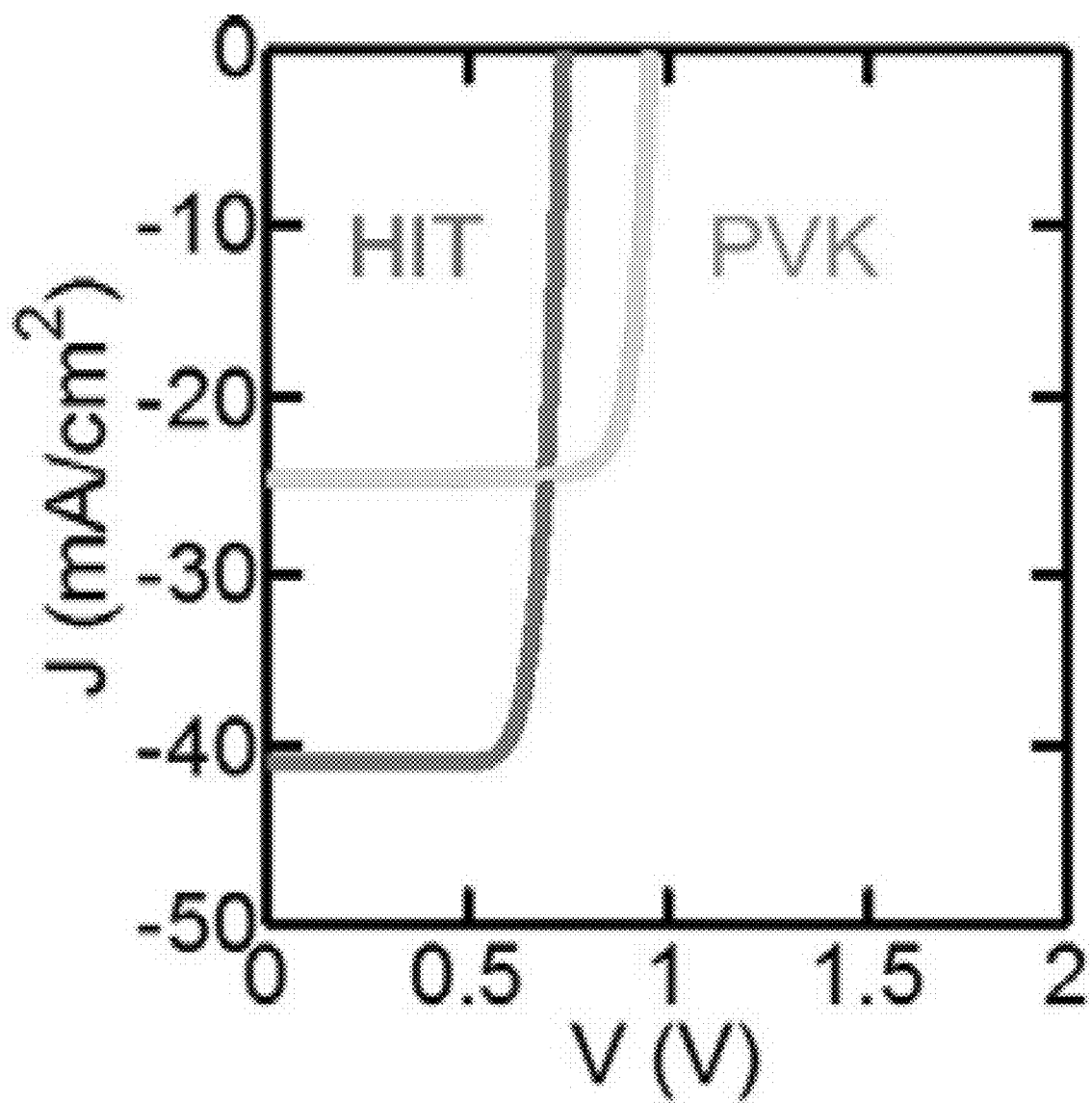
FIG. 9A shows J-V characteristics of an individual heterojunction with an intrinsic thin layer (HIT)-silicon heterojunction (SHJ) and perovskite (PVK) cells, with an inset table showing sub-cells contribution to the efficiency, as described in *J. Mater. Chem. A* 2015, 3, 9152-9159.
Figure 9B:
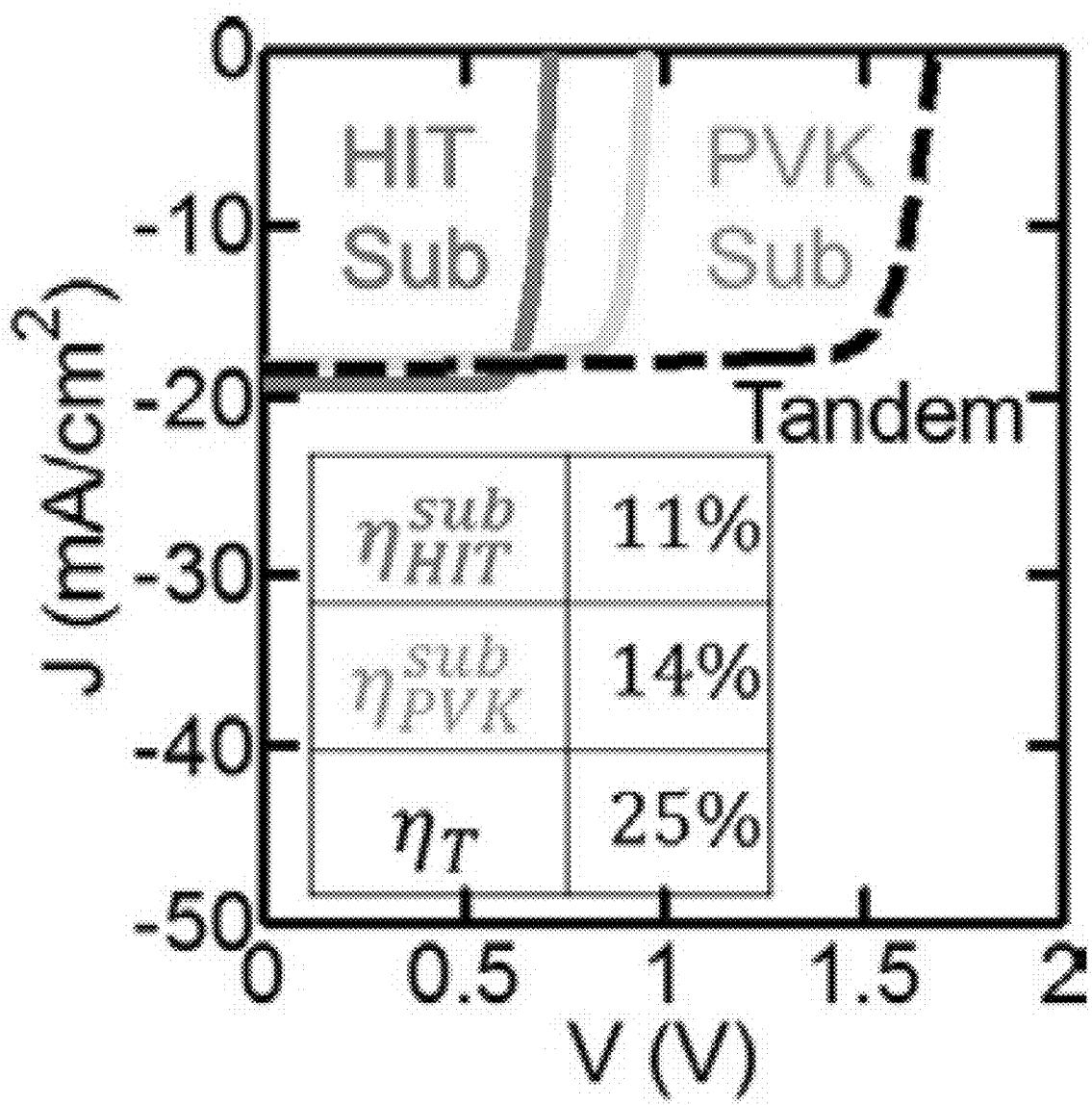
FIG. 9B shows J-V characteristics of a heterojunction with an intrinsic thin layer (HIT)-silicon heterojunction (SHJ) and perovskite sub-cell J-V characteristics along with the tandem cell, with an inset table showing sub-cells contribution to the efficiency, as as described in *J. Mater. Chem. A* 2015, 3, 9152-9159.

FIG. 9A shows the individual J-V characteristics of perovskite (PVT) and heterojunction with an intrinsic thin layer (HIT) cells. The heterojunction with an intrinsic thin layer (HIT) solar cell has a higher short circuit current density ($J_{sc}$) but lower open-circuit voltage ($V_{oc}$) compared to the PSC (as $E_{g,Si}<E_{g,PVT}$). FIG. 9B shows a tandem structure, the sub-cell currents must be matched.

Figure 10:
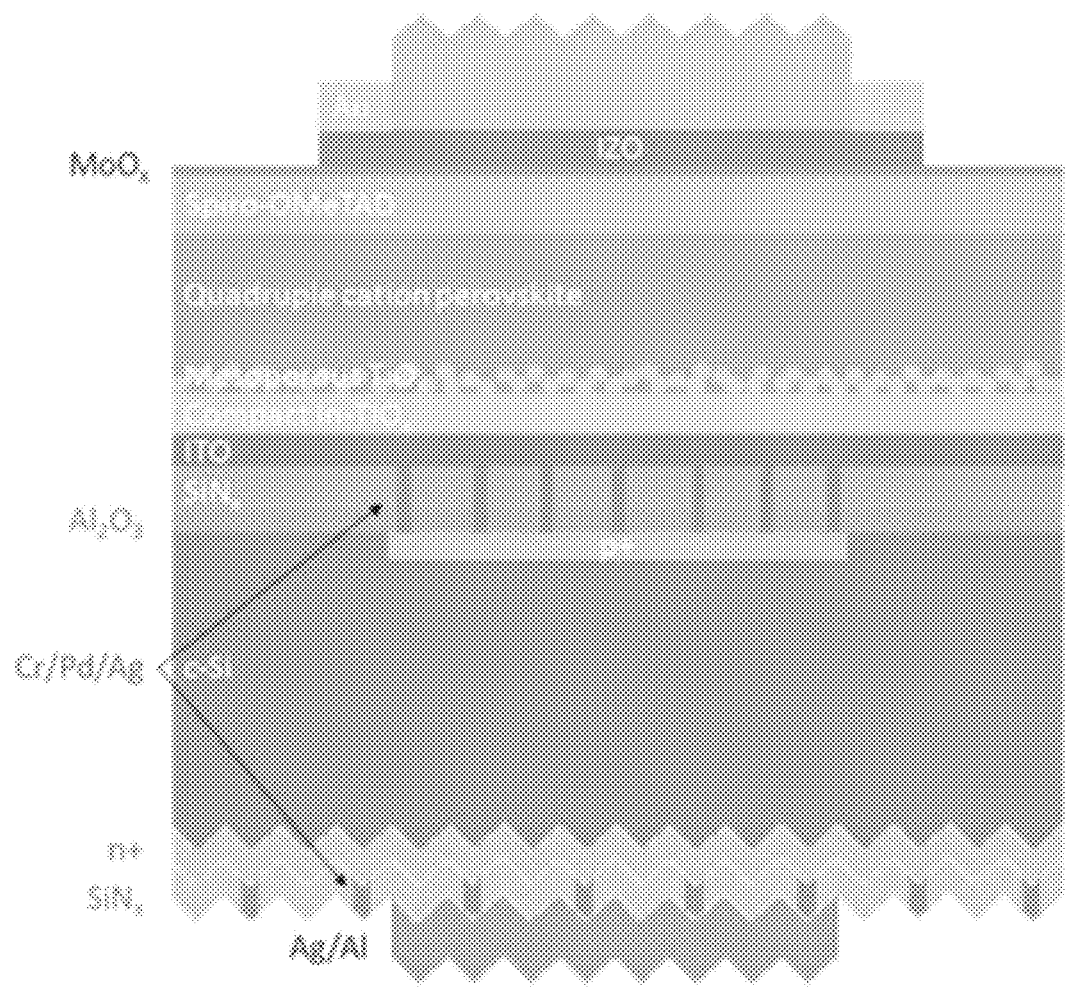
FIG. 10 shows a schematic of the perovskite/crystalline silicon monolithic tandem solar cell as described in *Ener. Env. Sci.* 2017, 10, 2472-2479.

FIG. 10 shows an arrangement from *Ener. Env. Sci.* 2017, 10, 2472-2479 (Wu) with a homo-junction c-Si cell architecture suitable for a perovskite (PVT)/c-Si tandem solar cell. Wu's structure allows high temperature processed compact and mesoporous $TiO_x$ layers to be used for the perovskite cell while allowing passivation layers on both sides of the c-Si sub-cell, thus maintaining a high open circuit voltage ($V_{oc}$) for the c-Si sub-cell in FIG. 10.

Figure 11:
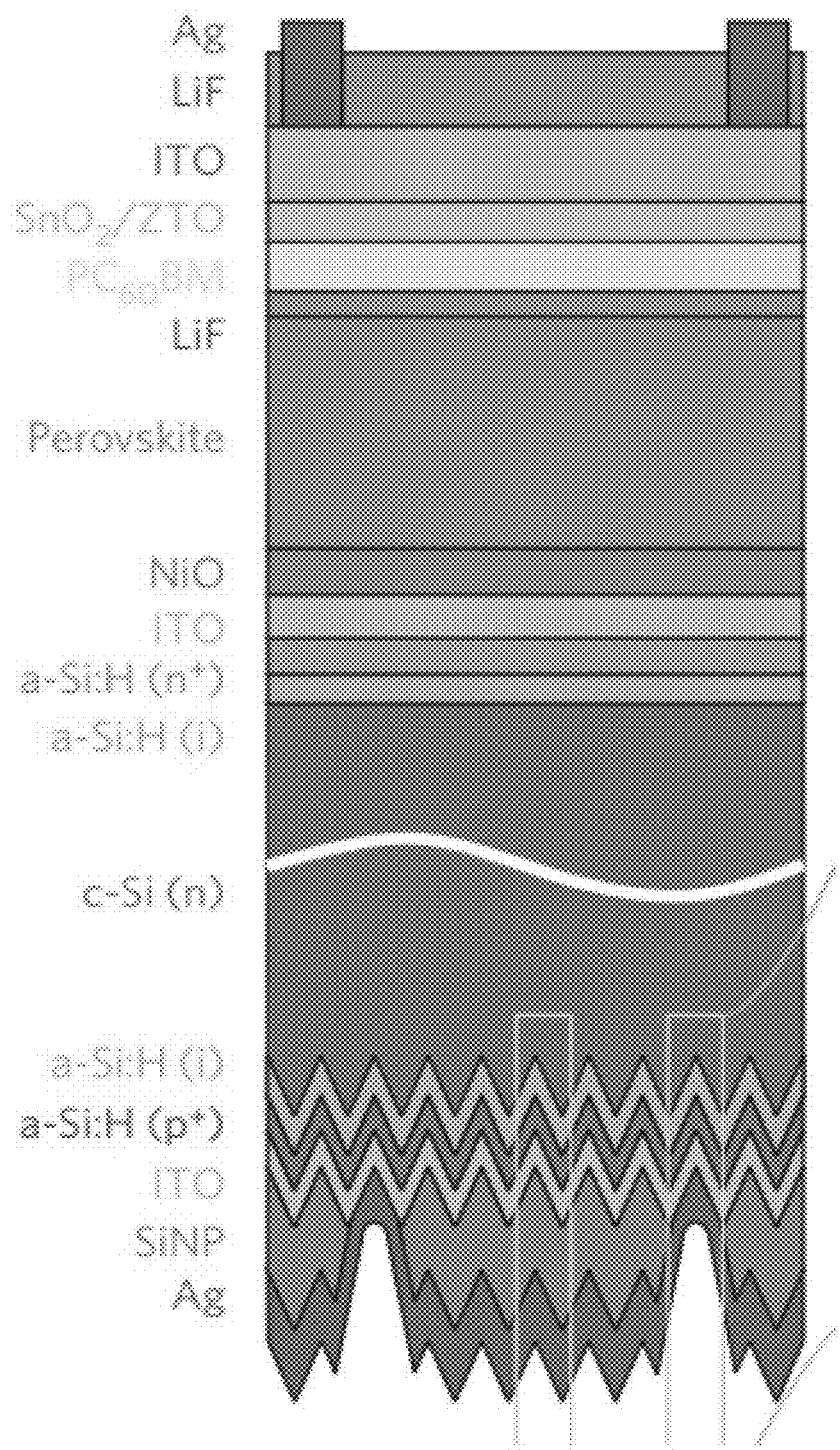
FIG. 11 shows a schematic of the single-junction, semitransparent perovskite solar cell described in *Nat. Ener.* 2017, 2, 17009.

FIG. 11 shows a structure from *Nat. Ener.* 2017, 2, 17009 (Bush) which achieved an efficiency of 23.6% for monolithic PVT/Si via merging an infrared-tuned HIT bottom cell with the cesium formamidinium lead halide perovskite (PVT). Bush used an LiF antireflection coating (ARC) on the top of the cell.

Figure 12:
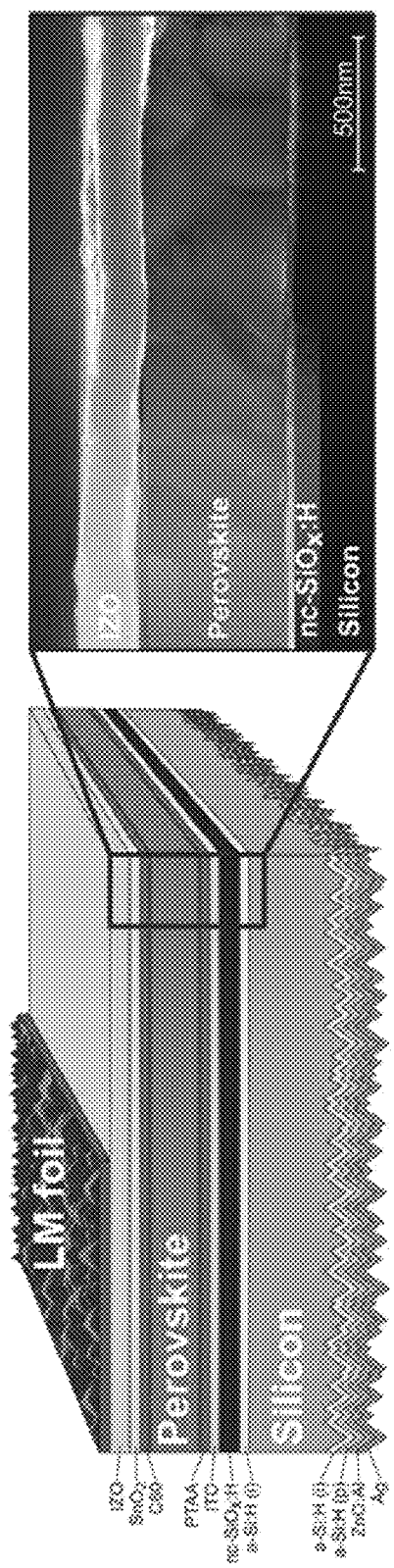
FIG. 12 shows a schematic of the experimentally realized architecture and cross-sectional scanning electron microscopy image from Ener. Environ. Sci. 2018, II, 3511.

FIG. 12 shows an arrangement from *Ener. Environ. Sci.* 2018, 77, 3511 (lost) that achieved 25.5% conversion efficiency monolithic perovskite (PVT)-Si by employing a textured light management foil on the front surface of the tandem cell.

Figure 13:
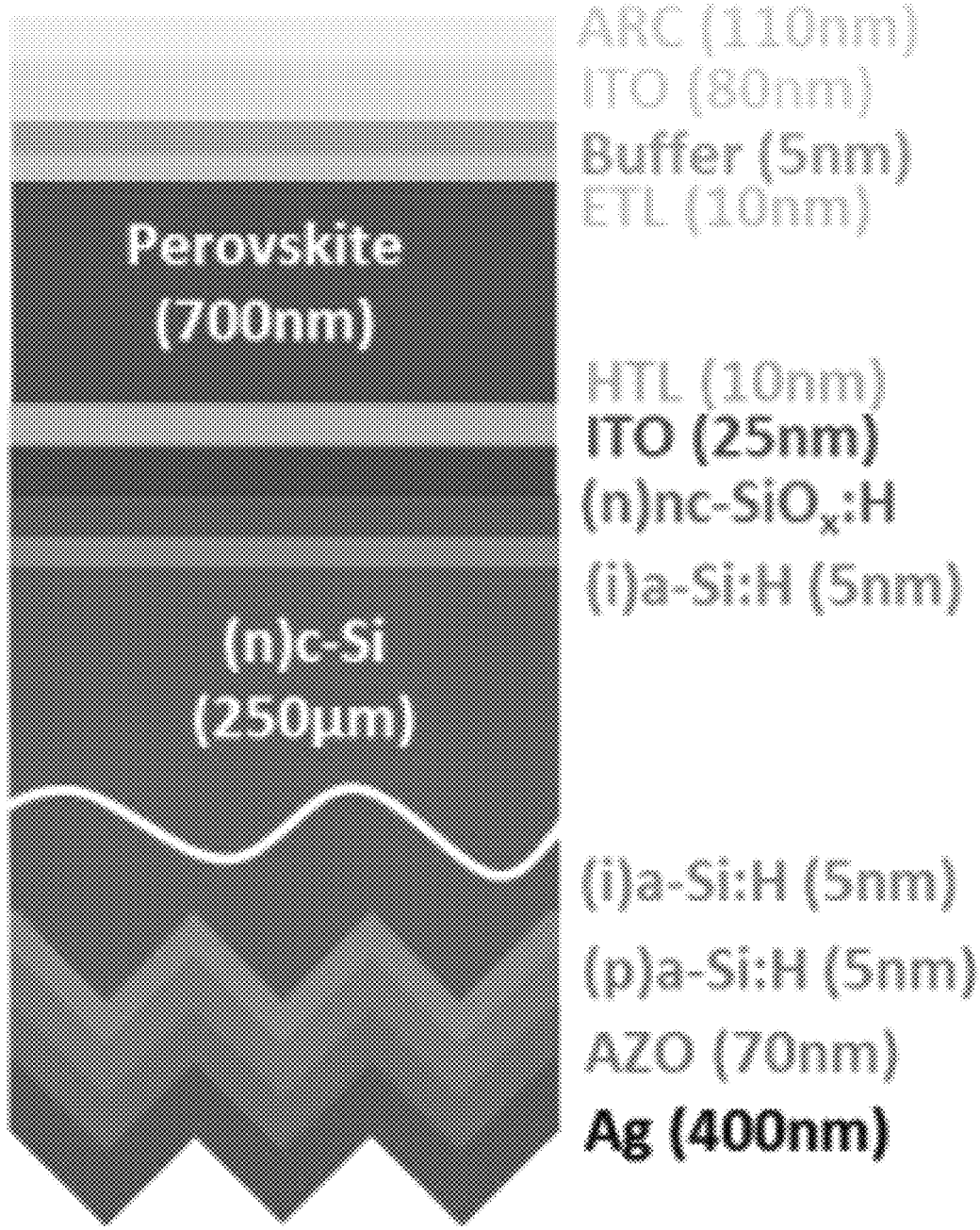
FIG. 13 shows a schematic of the simulated monolithic perovskite-silicon heterojunction (SHJ) tandem cell with layer thicknesses and morphological features being not to scale, from *Adv. Energy Mater.* 2019, 9, 1803241.

FIG. 13 shows a structure from *Adv. Energy Mater.* 2019, 9, 1803241 (Mazzarella) with 110 nm thick $SiO_x$ interlayers with a refractive index of 2.6 at 800 nm inserted between two sub-cells which enhanced the short circuit current density ($J_{sc}$, 1.4 mA/cm$^2$) of the heterojunction with an intrinsic thin layer (HIT) bottom cell. Mazzarella achieved a short circuit current density ($J_{sc}$) total (sum of $J_{sc}$ of both the sun-cells) of 38.7 mA/cm$^2$ and η of 25.2%.

Figure 14:
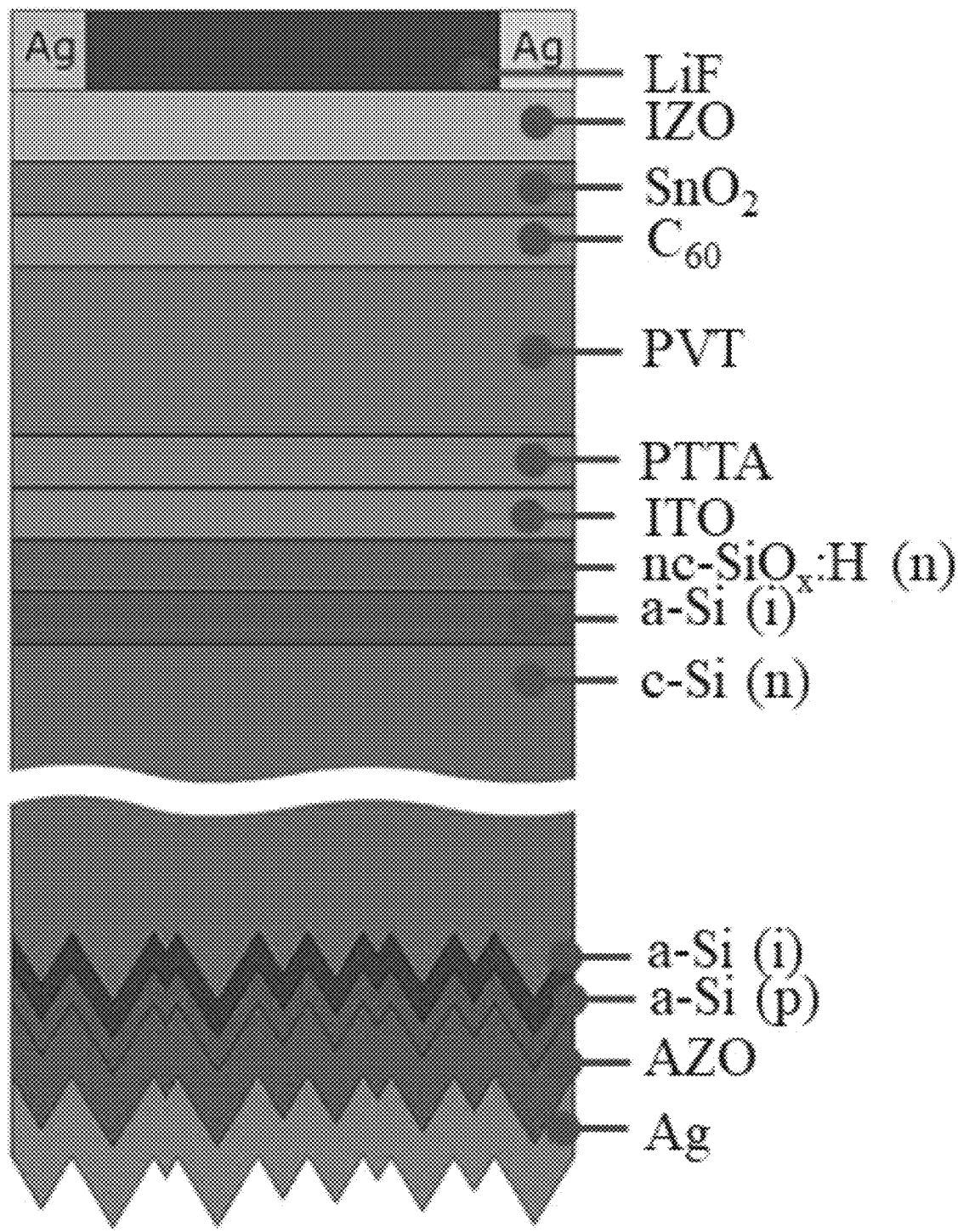
FIG. 14 shows a schematic of the perovskite (PVT)-Si tandem device architecture used in *Sustainable Energy Fuels* 2019, 3, 1995.

FIG. 14 shows an arrangement from *Sustainable Energy Fuels* 2019, 3, 1995 (Kohnen) with perovskite (PVT)-Si tandem cells with an efficiency of 26% by optimizing the current mismatch between perovskite (PVT) top and Si bottom cells. Kohnen combines rear junction Si heterojunction with an intrinsic thin layer (HIT) bottom cells with p-i-n perovskite (PVT) top cells for fabricating monolithic tandem structure.

Figure 15:
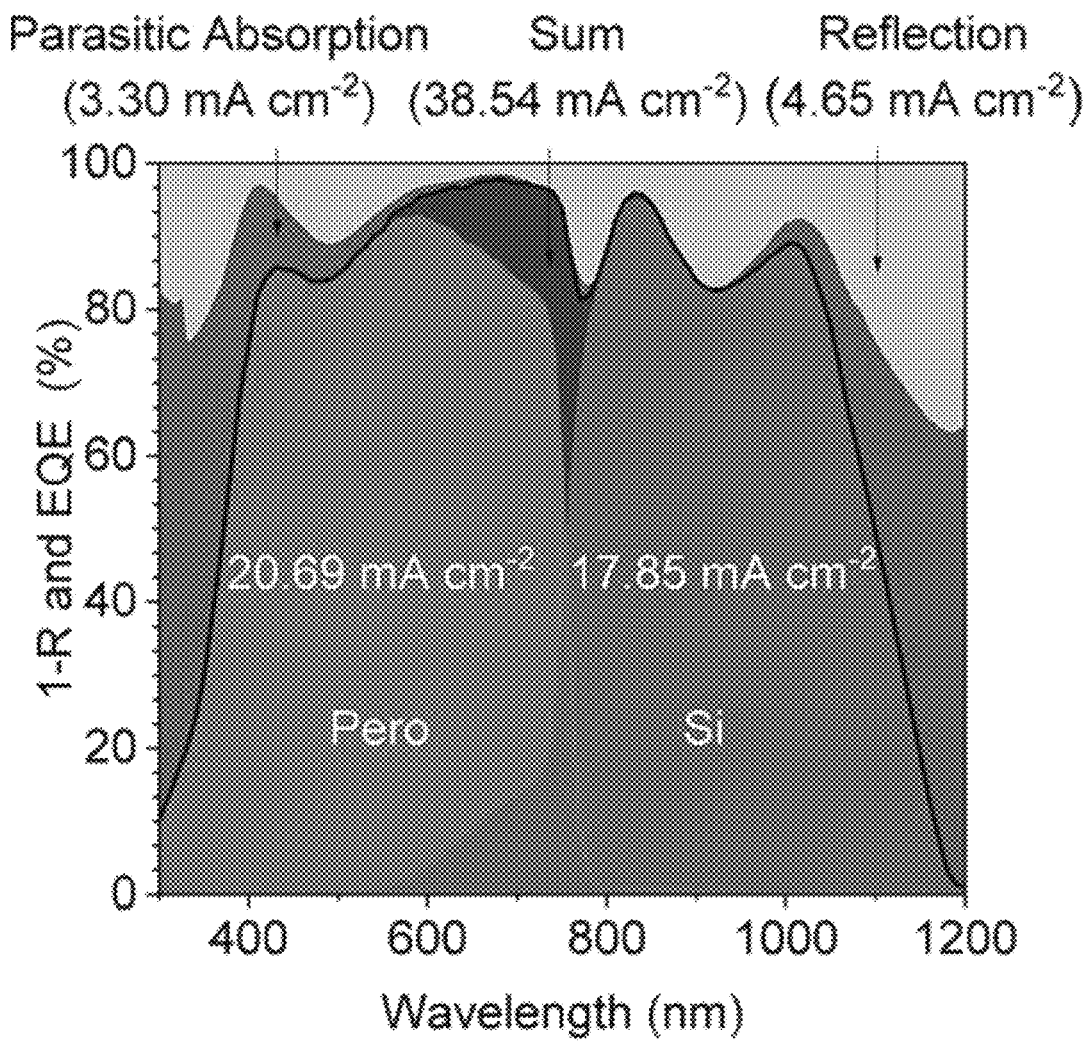
FIG. 15 shows the external quantum efficiency (EQE) measured and the reflection spectra of a tandem solar cell with integrated current densities and their sum, with the loss in current density due to parasitic absorption as the difference between sum of the EQE and 1-reflectance from *Sustainable Energy Fuels* 2019, 3, 1995.

FIG. 15 shows optical simulation results showing that there are two major losses in short circuit current density ($J_{sc}$) of 3.30 mA/cm$^2$ due to parasitic absorption and 4.65 mA/cm$^2$ due to reflection losses.

Figure 16:
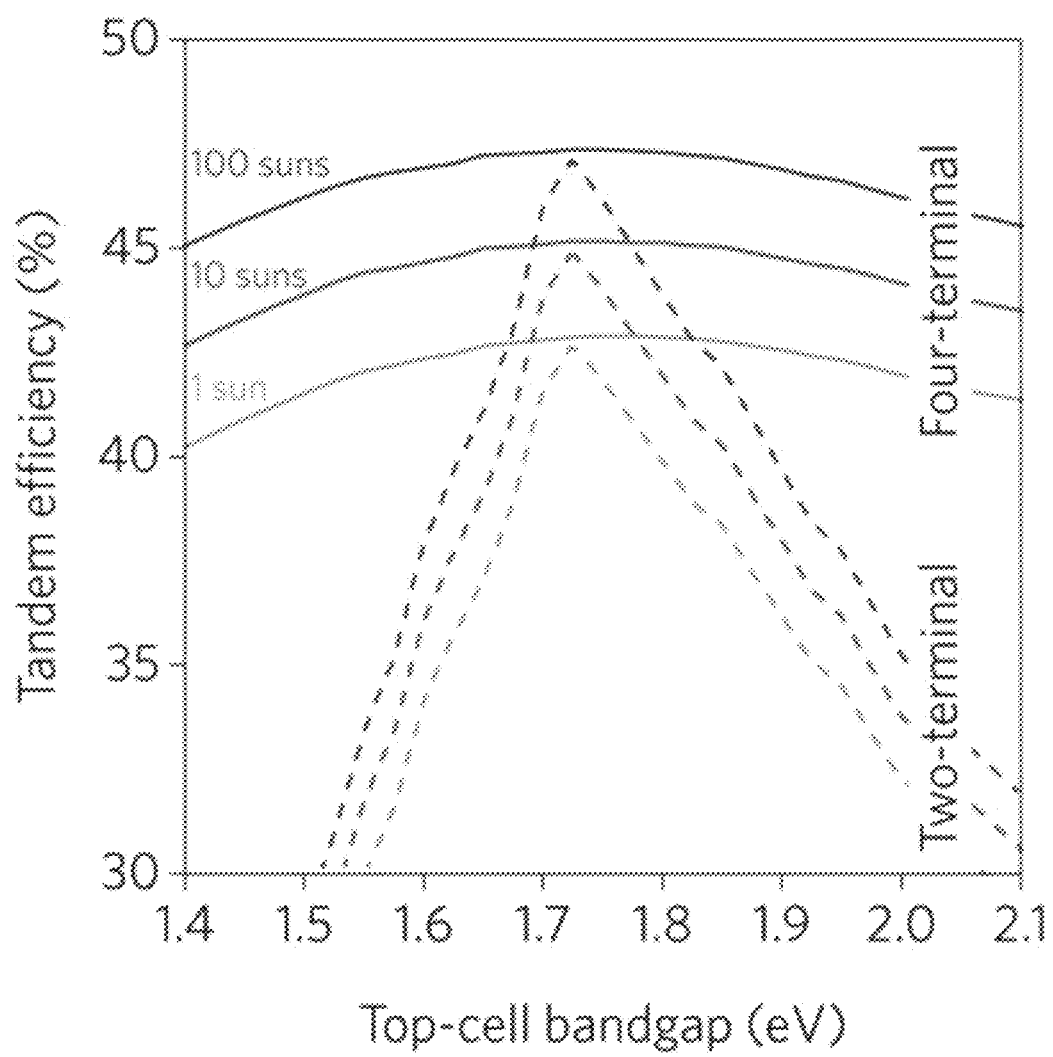
FIG. 16 shows the theoretical efficiency of a perovskite (PVT)-Si tandem solar cell for varying top-cell bandgap, showing efficiencies for two-terminal and four-terminal configurations *Nat. Ener.* 2016, 7, 16137.

FIG. 16 shows that the theoretical limit extends to 43% for perovskite (PVT)/Si tandem solar cells for both two-terminal or four-terminal configurations.

FIG. 17 shows the conduction band minimum (CBM), $E_c$ (−4.05 eV) and valence band maximum (VBM), $E_v$ (−5.17 eV) of Si ($E_g$≈1.12 eV), which are between the lowest energy unoccupied molecular orbital (LUMO) and the highest energy occupied molecular orbital (HOMO) of the perovskite material, i.e., LUMO≈−3.80 eV, HOMO≈−5.30 eV, and $E_g$≈1.50 eV for methylammonium lead iodide.

FIG. 18 shows the dependency of the conduction band minimum (CBM) and the valence band maximum (VBM) of porous silicon (PS).

FIG. 19A shows the mechanism of p-type porous silicon (p-PS) as electron-transport material (ETM), and FIG. 19B shows the mechanism of n-type porous silicon (n-PS) as hole-transport material (HTM).

FIG. 20 shows a PVT/Si tandem solar cell arrangement on an n-type silicon wafer. The values of conduction band minimum (CBM, $E_{cPS}$) and valence band maximum (VBM, $E_{vPS}$) were tuned by controlling the porosity of the silicon surface which can directly extract the electron from the perovskite (PVT) top solar cell.

FIG. 21 shows an exemplary inventive perovskite (PVT)-silicon tandem solar cell structure on a p-type silicon wafer.

Examples

An exemplary method useful for preparing n-type and p-type silicon wafer arrangements within the scope of the present disclosure are given below.

Figure 22:
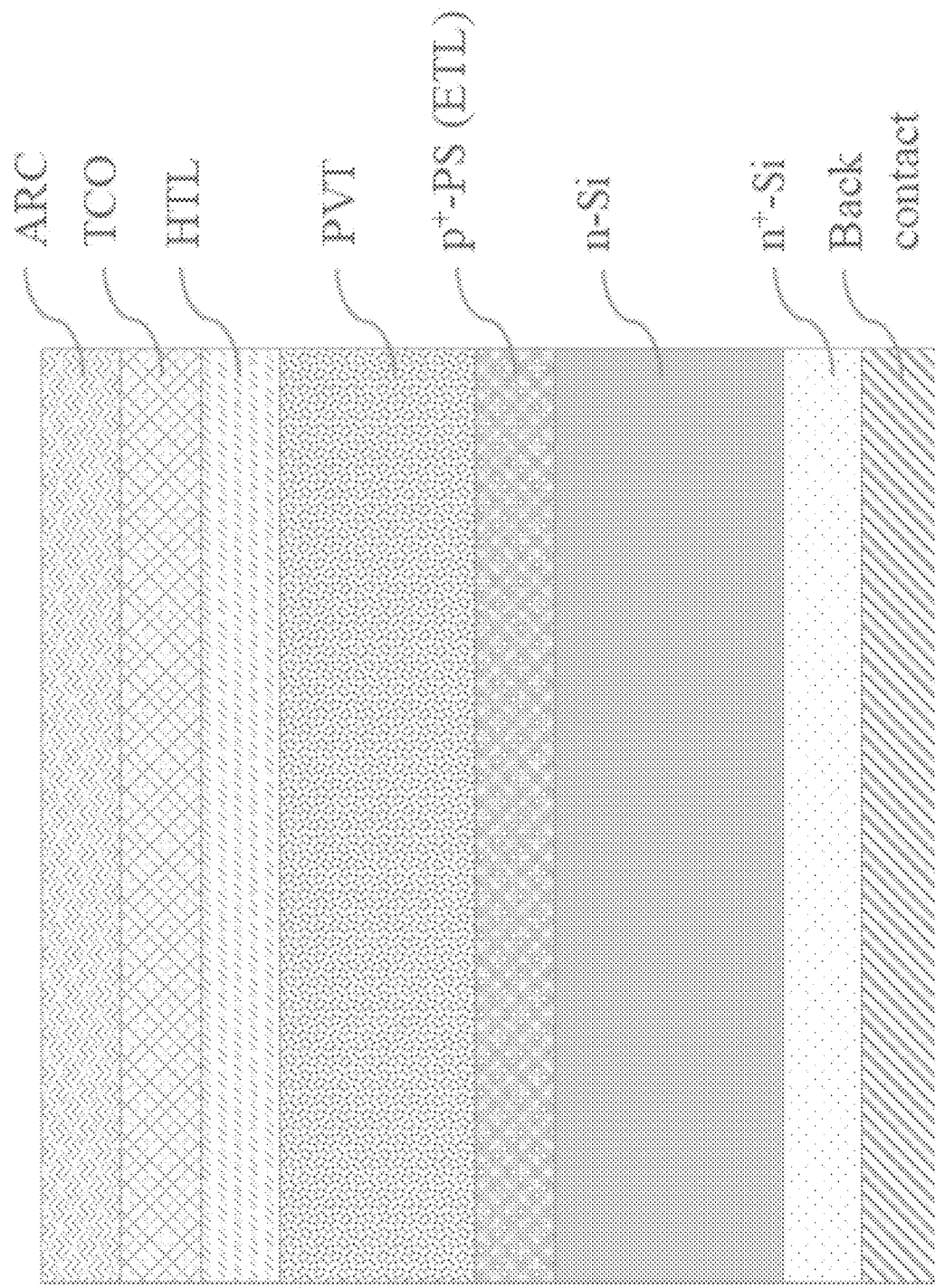
FIG. 22 shows a schematic of an exemplary inventive monolithic perovskite (PVT)-silicon concept for n-type wafer based homo-junction silicon solar cell.

For n-type Si wafers (FIG. 22): An n-type silicon wafer in an inventive tandem solar cell can be fabricated using a polished n-type Si wafer of resistivity 1 to 10 Ωcm, e.g., at least 1, 1.5, 2, 2.5, 3, 3.5, 4, 4.5, or 5 Ωcm and/or up to 10, 9.5, 9, 8.5, 8, 7.5, 7, 6.5, 6, 5.5, or 5 Ωcm, and thickness of around 200 μm (±1, 2, 2.5, 3, 4, 5, 7.5, 10, 15, 20, 25, 30, 40, 50, or 75 μm, or a range including any of these endpoints) as a starting material. The wafers may be cleaned using the Werner Kern, Radio Corporation of America (RCA) cleaning process, involving: firstly removing the organic contaminants, i.e., organic clean plus particle clean, with, e.g., 5 parts of deionized water, 1 part of 29 wt. % $NH_3$ (aq.), and 1 part of 30 wt. % $H_2O_2$ (aq.), secondly removing thin oxide layer(s), with an optional oxide strip, and thirdly removing ionic contamination, i.e., ionic clean, with, e.g., 6 parts of deionized water, 1 part of 37 wt. % HCl (aq.), and 1 part of 30 wt. % $H_2O_2$ (aq.), secondly removing thin oxide layer(s). The front side and back side of the wafer can be simultaneously diffused using a B-source and P-source to create a $p^+$/n junction and n/$n^+$ (low-high) junction. A Ti/Ag back contact can provided via evaporation or sputtering of Ti (10 nm) and Ag (500 nm) metals, though it is believed that any suitable back contact may be used. Porous silicon (PS) can be grown on $p^+$ surface via chemical or electrochemical route. A $SiO_2$ and/or $Al_2O_3$ layer of approximately 10 nm (±0.25, 0.5, 0.75, 1, 1.33, 1.5, 1.67, 2, 2.33, 2.5, 2.67, 3, 3.33, 3.5, 3.67, 4, 4.5, or 5 nm, or a range including any of these endpoints) thickness can be deposited via atomic layer deposition (ALD) or sputtering techniques on the porous silicon (PS). A perovskite (PVT) layer can be deposited via chemical vapor deposition (CVD), evaporation, a solution process, or a combination of these. A hole-transporting material (HTM) layer including, e.g., NiO, NiO:Cu, and/or $WO_3$, can be deposited via spin coating or any known method. A front contact comprising one or more transparent conductive oxide (TCO) materials, such as indium tin oxide (ITO), indium zinc oxide (IZO), aluminum-doped zinc oxide (AZO), gallium-doped zinc oxide (GZO), indium cerium oxide (ICO), indium tungsten oxide (IWO), zinc indium tin oxide (ZITO), zinc indium oxide (ZIO), zinc tin oxide (ZTO), GITO (gallium indium tin oxide), gallium indium oxide (GIO), gallium zinc oxide (GZO), aluminum-doped zinc oxide (AZO), fluorinated tin oxide (FTO), ZnO, or and/or indium-doped cadmium oxide (ICO), can be deposited via thermal evaporation or sputtering.

Figure 23:
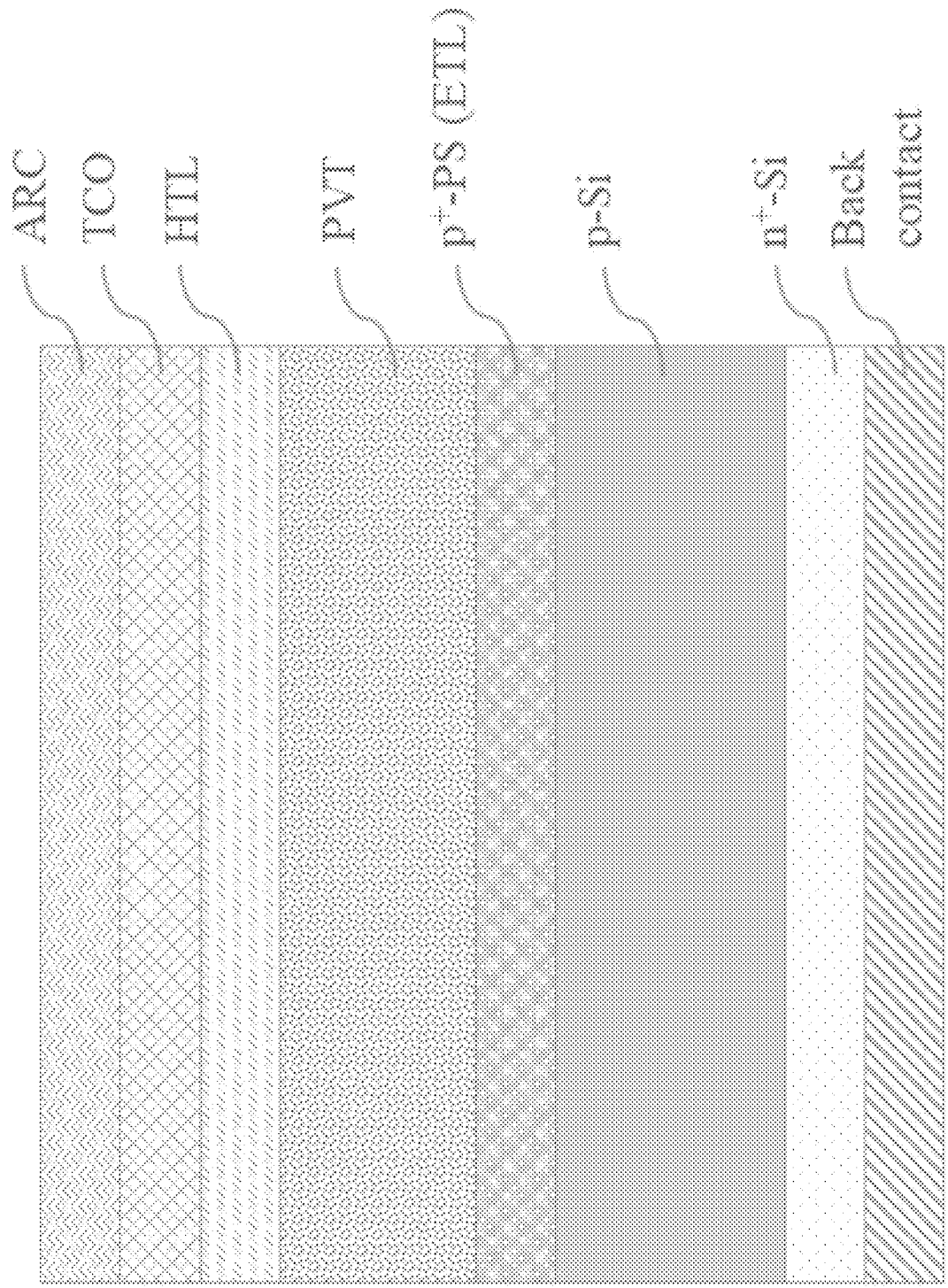
FIG. 23 shows a schematic of an exemplary inventive monolithic perovskite (PVT)-silicon concept for p-type wafer based homo-junction silicon solar cell.

For p-type Si wafers (FIG. 23): The same method as for n-type silicon wafers may be used, except that at least the front and backside of the wafer are simultaneously diffused using B-source (low doping, $p^+$/p junction) and P-source to create p/n junction.

Numerous modifications and variations of the present invention are possible in light of the above teachings. It is therefore to be understood that within the scope of the appended claims, the invention may be practiced otherwise than as specifically described herein.

DRAWING LEGEND

ARC anti-reflection coating
TCO transparent conductive oxide
HTL hole-transporting layer
PVT photovoltaic/thermal layer
$p^+$PS ETL (doped) porous silicon electron-transporting layer
n-Si n-type silicon layer
$n^+$-Si doped n-type silicon layer (a homojunction with n-Si)
p-Si p-type silicon layer

The invention claimed is:
1. A tandem photovoltaic cell, comprising, in order relative to incident light:
an anti-reflection outer layer;
a transparent conductive oxide layer;
a hole transport layer;
a perovskite layer;
an electron transport layer comprising $p^+$-porous silicon;
an n-type silicon layer or a p-type silicon layer;
an $n^+$-doped n-type silicon layer; and
a back contact;
wherein the $n^+$-doped n-type silicon layer is a homojunction with the n-type silicon layer.

2. The tandem photovoltaic cell of claim 1, wherein the:
$n^+$-doped n-type silicon layer is a heterojunction with the p-type silicon layer.
3. The tandem photovoltaic cell of claim 1, wherein the electron transport layer comprises at least 90 wt. % $p^+$-porous silicon, relative to total electron transport layer weight.
4. The tandem photovoltaic cell of claim 1, wherein the electron transport layer comprises no filler.
5. The tandem photovoltaic cell of claim 1, wherein the electron transport layer comprises no perovskite material beyond a depth of 10% of an electron transport layer thickness.
6. The tandem photovoltaic cell of claim 1, wherein the perovskite layer directly contacts the electron transport layer.
7. The tandem photovoltaic cell of claim 1, wherein the electron transport layer directly contacts the n-type silicon layer or the p-type silicon layer.
8. The tandem photovoltaic cell of claim 1, wherein the anti-reflection outer layer directly contacts the transparent conductive oxide layer,
wherein the transparent conductive oxide layer directly contacts the hole transport layer,
wherein the hole transport layer directly contacts the perovskite layer, and
wherein the perovskite layer directly contacts the electron transport layer.
9. The tandem photovoltaic cell of claim 1, wherein the perovskite layer directly contacts the electron transport layer, and
wherein the electron transport layer directly contacts the n-type silicon layer or the p-type silicon layer.
10. The tandem photovoltaic cell of claim 1, comprising no antireflective layer between a charge transporting layer, light absorbing layers, and/or silicon layer.
11. The tandem photovoltaic cell of claim 1, comprising no reflective layer beneath the electron transport layer relative to the incident light.
12. The tandem photovoltaic cell of claim 1, wherein the perovskite layer comprises a compound of formula (I)

$$RNH_3PbX_3 \qquad (I),$$

wherein R is an alkyl group and X is a halide.
13. The tandem photovoltaic cell of claim 12, wherein R is methyl or ethyl and X is Br or I.
14. The tandem photovoltaic cell of claim 1, having a photon conversion efficiency of at least 20%.
15. A method of producing electricity, comprising irradiating the tandem photovoltaic cell of claim 1 with sunlight.
16. A method of making the tandem photovoltaic cell of claim 1, the method comprising:
combining the perovskite layer with an upper surface of the electron transport layer, in a direction relative to the incident light.
17. A method of improving efficiency of the tandem photovoltaic cell of claim 1, the method comprising:
irradiating the incident light through the electron transport layer comprising the $p^+$-porous silicon,
wherein the photon conversion efficiency is improved relative to tandem perovskite solar cells lacking the $p^+$-porous silicon.
18. A method of improving an efficiency of a tandem solar cell, the method comprising:
forming a perovskite layer on an electron transport layer comprising at least 90 wt. % $p^+$-porous silicon, relative to a total electron transport layer weight; and further processing to provide the tandem solar cell comprising, in order of incident light, an anti-reflection layer, a transparent conductive oxide layer, a hole transport layer, the perovskite layer, the electron transport layer, a p-type or n-type silicon layer, an $n^+$-doped silicon layer, and a back contact.

* * * * *